(12) United States Patent
Nagato et al.

(10) Patent No.: US 11,539,292 B2
(45) Date of Patent: Dec. 27, 2022

(54) POWER CONVERTER CONTROL DEVICE WITH FEEDFORWARD

(71) Applicant: Mitsubishi Electric Corporation, Tokyo (JP)

(72) Inventors: Shuichi Nagato, Tokyo (JP); Miwako Tanaka, Tokyo (JP); Akihiko Iwata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 289 days.

(21) Appl. No.: 16/959,438

(22) PCT Filed: Dec. 5, 2018

(86) PCT No.: PCT/JP2018/044743
§ 371 (c)(1),
(2) Date: Jul. 1, 2020

(87) PCT Pub. No.: WO2019/159504
PCT Pub. Date: Aug. 22, 2019

(65) Prior Publication Data
US 2020/0373836 A1 Nov. 26, 2020

(30) Foreign Application Priority Data

Feb. 16, 2018 (JP) .............................. JP2018-025948

(51) Int. Cl.
*H02M 3/157* (2006.01)
*G01R 19/165* (2006.01)
(Continued)

(52) U.S. Cl.
CPC ...... *H02M 3/157* (2013.01); *G01R 19/16528* (2013.01); *G06N 3/04* (2013.01);
(Continued)

(58) Field of Classification Search
CPC ..... G05F 1/00; G05F 1/10; G05F 1/12; G05F 1/46; G05F 1/455; G05F 1/45;
(Continued)

(56) References Cited

U.S. PATENT DOCUMENTS 5,457,624 A * 10/1995 Hastings ............... H02M 3/158
363/127
5,907,450 A 5/1999 Ishikawa
(Continued)

FOREIGN PATENT DOCUMENTS

| CN | 104756389 | * 10/2013 |
| CN | 103812342 | * 5/2014 |

(Continued)

OTHER PUBLICATIONS

Yun Wei Li et al: "Investigation and Improvement of Transient Response of DVR at Medium Voltage Level", IEEE Transactions on Industry Applications, IEEE Service Center, Piscataway, NJ, US, vol. 43, No. 5, Sep. 1, 2007, pp. 1309-1319.

(Continued)

*Primary Examiner* — Thienvu V Tran
*Assistant Examiner* — Nusrat Quddus
(74) *Attorney, Agent, or Firm* — Xsensus LLP

(57) ABSTRACT

A subtracting unit calculates a voltage deviation of an output voltage of a DC-to-DC converter from a target voltage. A feedback control variable calculator calculates a feedback control variable in each control cycle. In a control cycle in which a crossing of the output voltage and the target voltage is detected by a feedforward control determination unit, a feedforward control variable calculator calculates a feedforward control variable so that a change in the output voltage is prevented. A switching control signal generator generates a control signal for the DC-to-DC converter for controlling (Continued)

the output voltage, according to a summation of the feedforward control variable and the feedback control variable.

8 Claims, 17 Drawing Sheets

(51) Int. Cl.
  *G06N 3/04* (2006.01)
  *G06N 3/08* (2006.01)
  *H02M 1/00* (2006.01)
(52) U.S. Cl.
  CPC ............ *G06N 3/08* (2013.01); *H02M 1/0012* (2021.05); *H02M 1/0016* (2021.05)
(58) Field of Classification Search
  CPC ... G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H02M 3/1584; H02M 3/285; H02M 3/33561; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H05B 39/048; B23K 11/24; H04B 2215/069; H02J 3/46; H02J 3/38
  See application file for complete search history.

(56) References Cited

U.S. PATENT DOCUMENTS

| | | | | |
|---|---|---|---|---|
| 6,122,135 | A * | 9/2000 | Stich .................... | G11B 5/5547 360/78.04 |
| 6,125,000 | A * | 9/2000 | Carlson ................ | G11B 21/083 360/78.04 |
| 7,450,127 | B2 * | 11/2008 | Hong .................. | G05B 19/4103 345/619 |
| 8,493,046 | B2 | 7/2013 | Kurokawa et al. | |
| 8,901,899 | B1 * | 12/2014 | Kiadeh ................ | H02M 3/1588 323/285 |
| 9,413,270 | B2 * | 8/2016 | Liu .................... | H02M 7/53871 |
| 9,929,663 | B1 * | 3/2018 | Babazadeh ........ | H02M 3/33592 |
| 10,063,143 | B1 * | 8/2018 | Fan ........................ | H02M 5/458 |
| 2002/0159187 | A1 * | 10/2002 | Kagami ............. | G11B 5/59622 360/77.02 |
| 2006/0250120 | A1 * | 11/2006 | King ..................... | H02M 3/157 323/283 |
| 2009/0237052 | A1 * | 9/2009 | Takasu .................... | H02M 7/48 323/282 |
| 2010/0231183 | A1 * | 9/2010 | Jan ........................ | H02M 3/156 323/282 |
| 2013/0003420 | A1 * | 1/2013 | Ye ..................... | H02M 3/33515 363/17 |
| 2014/0233279 | A1 * | 8/2014 | Kondo ................ | H02M 5/4585 363/37 |
| 2017/0062110 | A1 * | 3/2017 | Matsumoto ......... | F02D 41/1408 |
| 2018/0050603 | A1 * | 2/2018 | Hand, III .............. | H02J 7/0019 |
| 2018/0152099 | A1 * | 5/2018 | Savic .................... | H02M 3/156 |
| 2018/0262107 | A1 * | 9/2018 | Raval .................. | H02M 3/158 |
| 2018/0292792 | A1 * | 10/2018 | Ikai ..................... | G05B 13/042 |
| 2018/0299919 | A1 * | 10/2018 | Kesarwani ........... | H02M 3/158 |
| 2018/0301985 | A1 * | 10/2018 | Kesarwani ................ | G05F 5/00 |

FOREIGN PATENT DOCUMENTS

| | | | | |
|---|---|---|---|---|
| DE | 102016111411 | A1 * | 12/2016 | ............. G05B 13/04 |
| EP | 3614548 | A1 * | 2/2020 | ......... H02M 1/4208 |
| JP | 2-54304 | A | 2/1990 | |
| JP | 6-102905 | A | 4/1994 | |
| JP | 9-146645 | A | 6/1997 | |
| JP | 5412658 | B2 | 2/2014 | |
| WO | WO-2017032420 | A1 * | 3/2017 | ............. H02M 1/08 |

OTHER PUBLICATIONS

Feng Q et al: "Digital control of a boost converter using Posicast", APEC 2003. 18th. Annual IEEE Applied Power Electronics Conference and Exposition Miami Beach, FL, Feb. 9-13, 2003; New York, NY: IEEE, US, Feb. 9, 2003, pp. 990-995 vol. 2.
Extended European Search Report dated Feb. 15, 2021 in European Application No. 18906248.2.
Office Action dated Jan. 13, 2022, in corresponding European patent Application No. 18906248.2, 6 pages.
Fujio Kurokawa et al., "A Reference Modification Model Digitally Controlled DC-DC Converter for Improvement of Transient Response", IEEE Transactions on Power Electronics, Institute of Electrical and Electronics Engineers, vol. 31, No. 1, Jan. 1, 2016, pp. 871-883.
International Search Report and Written Opinion dated Feb. 26, 2019 for PCT/JP2018/044743 filed on Dec. 5, 2018, 8 pages including English Translation of the International Search Report.

* cited by examiner

POWER CONVERTER CONTROL DEVICE WITH FEEDFORWARD

CROSS-REFERENCE TO RELATED APPLICATIONS

The present application is based on PCT filing PCT/JP2018/044743, filed Dec. 5, 2018, which claims priority to JP 2018-025948, filed Feb. 16, 2018, the entire contents of each are incorporated herein by reference.

TECHNICAL FIELD

The present disclosure relates to a power converter control device, and, more particularly, to a control device which has a feedforward control function for controlling power converters, including a DC-to-DC converter.

BACKGROUND ART

U.S. Pat. No. 5,412,658 (PTL 1) discloses a technology for mitigating an overshoot or an undershoot in controlling a DC-to-DC converter by combining feedforward control by machine learning control such as neurocontrol and feedback control.

In PTL 1, a feedforward control variable is calculated by multiplying a deviation, between a control target value at a certain sampling and a control predicted value calculated from a learning history, by a gain α. The gain α at the n-th sampling is set so as to decrease from a factor A (a non-zero positive value) for suppressing the initial (the first) undershoot or overshoot, according to an attenuation function, specifically, according to $A*\exp(-\lambda*n)$. Here, λ is a factor (a non-zero positive value) for attenuating the second overshoot or undershoot. This allows suppression of the initial undershoot or overshoot and overcompensation of the overshoot or undershoot thereafter.

CITATION LIST

Patent Literature

PTL 1: U.S. Pat. No. 5,412,658

SUMMARY OF INVENTION

Technical Problem

A concern with the feedforward control disclosed in PTL 1 is that, depending on the selection of factors A and β which are predetermined by simulation or a control theory, the gain is inappropriate and mitigation effects on the second overshoot or undershoot are hardly exhibited. Moreover, since the control predicted value is determined by machine learning at each sampling, a computational load may affect the control response speed.

The present disclosure is made to solve such a problem. An object of the present disclosure is to provide a power converter control device that has a feedforward control function for suppressing an overshoot or undershoot, without increasing computational load during operation.

Solution to Problem

According to a certain aspect of the present disclosure, a power converter control device for a power converter whose output changes according to a control signal includes: a feedback controller; a feedforward controller; and a control signal generator. The feedback controller calculates, in each control cycle, a first control variable based on a deviation in the output from a target output. The feedforward controller calculates, if a first deviation and a second deviation have different polarities, a second control variable in a current control cycle according to a difference between the first deviation and the second deviation so that a change in the output from an immediately preceding control cycle to the current control cycle is prevented, the first deviation being the deviation in the current control cycle, the second deviation being the deviation in the immediately preceding control cycle. The control signal generator generates the control signal in each control cycle, according to the first control variable and the second control variable.

Advantageous Effects of Invention

According to the present disclosure, in response to an output of the power converter crossing the target output, the feedforward control can be caused to act to prevent a change (increase or decrease) in output of the power converter at the current time. Accordingly, the output can be matched with the target output and an overshoot and an undershoot in a transient state can be suppressed, without involving an attenuation operation on a feedforward control gain and a machine learning operation for each control cycle.

BRIEF DESCRIPTION OF DRAWINGS

FIG. 11 is a flowchart illustrating a FF control gain calculation routine shown in

FIG. 7.

DESCRIPTION OF EMBODIMENTS

Figure 1:
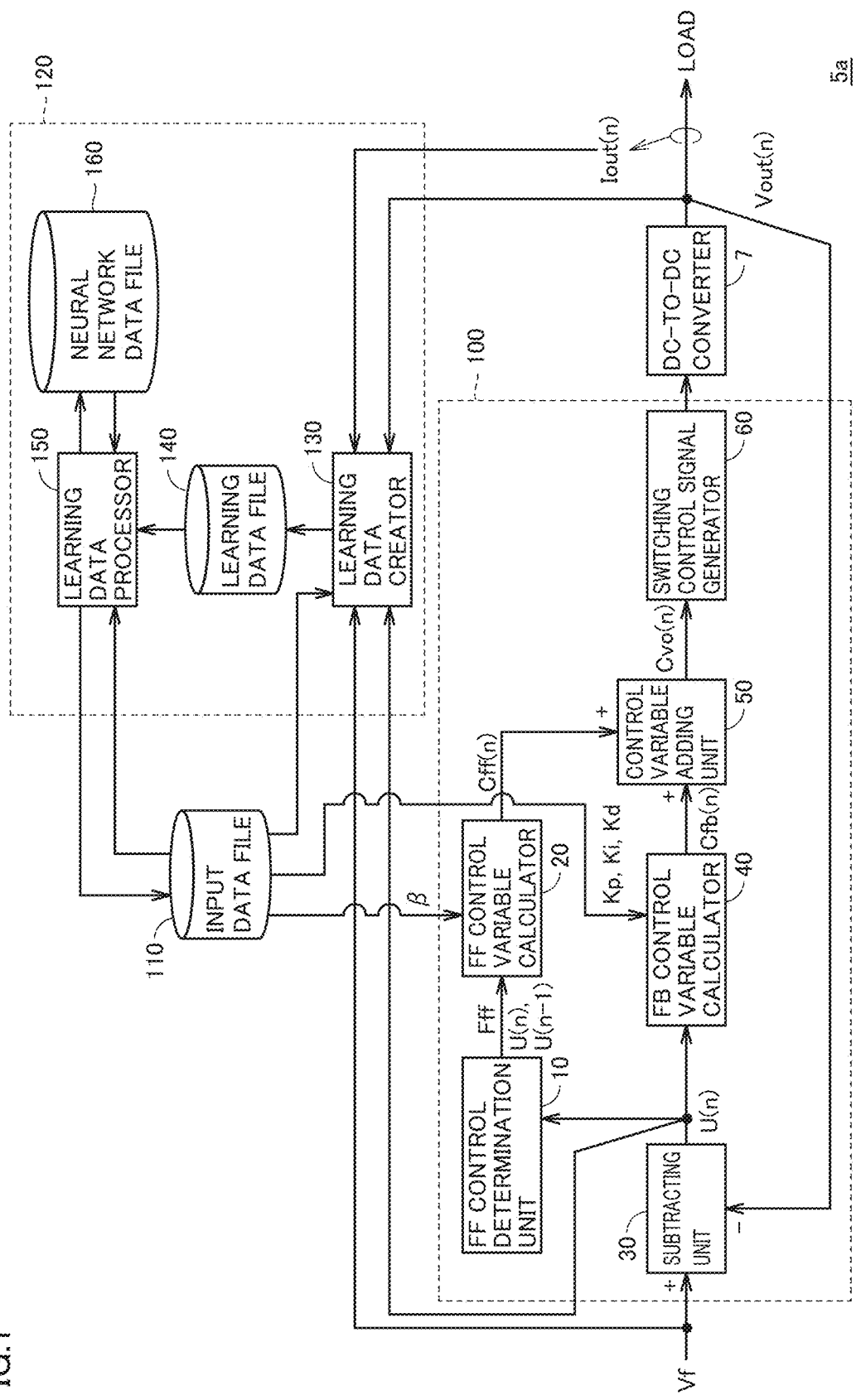
FIG. 1 is a functional block diagram illustrating a configuration of a DC-to-DC converter control device according to Embodiment 1.

Hereinafter, embodiments according to the present disclosure will be described, with reference to the accompanying drawings. Note that like reference signs are used to refer to like or corresponding parts in the drawings, and the description thereof will, in principle, not be repeated.

Embodiment 1

FIG. 1 is a functional block diagram illustrating a configuration of a DC-to-DC converter control device 5a shown as a representative example of a power converter control device according to Embodiment 1. In the following, in the present embodiment, a DC-to-DC converter will be illustrated as a power converter which is controlled by control device 5a.

Referring to FIG. 1, a DC-to-DC converter 7, shown as one example power converter which is controlled by control device 5a, supplies a load with a direct-current (DC) power indicated by a product of an output voltage Vout and a load current Iout. Control device 5a controls output voltage Vout of DC-to-DC converter 7 to a target voltage Vf. Control device 5a includes a voltage controller 100, an input data file 110, and a learning controller 120. Output voltage Vout and load current Iout are detected by a voltage sensor and a current sensor (none of which are shown), and detection values by the sensors are input to control device 5a.

Voltage controller 100 has a feed-forward (FF) control determination unit 10, a feed-forward (FF) control variable calculator 20, a subtracting unit 30, a feedback (FB) control variable calculator 40, a control variable adding unit 50, and a switching control signal generator 60. Learning controller 120 has a learning data creator 130, a learning data file 140, a learning data processor 150, and a neural network data file 160.

As hardware, control device 5a can include a processor, a memory device, an input circuit, and an output circuit (none of which are shown). For example, the processor can be configured of, for example, a central processing unit (CPU), a digital signal processor (DSP), an application specific integrated circuit (ASIC), etc.

The functional blocks included in control device 5a, shown in FIG. 1, can implement respective functionalities, typically, by the processor executing software (programs) stored in a memory device, such as a ROM, and cooperating with other hardware components, such as the memory device, the input circuit, and the output circuit, for example. Some or all of the functionalities of the functional blocks can be implemented also by a dedicated electronic circuit (hardware). Hardware components for implementing the functionalities of voltage controller 100, input data file 110, and learning controller 120 may be mounted on the same chip or different chips.

Voltage controller 100 controls DC-to-DC converter 7 by combining a feedback control and a feedforward control so that output voltage Vout of DC-to-DC converter 7 on the load side matches target voltage Vf and the range of changes in output voltage Vout in response to an abrupt change of the load is mitigated. Gain values used for the feedback control and the feedforward control are held in input data file 110.

Initially, a control operation by voltage controller 100 using these gain values will be described. In the following, voltage controller 100 performs the control operation for every fixed period $\Delta t$, that is, every control cycle. The current control cycle will be represented as the n-th (n: natural number) control cycle, and the immediately preceding control cycle will be represented as the (n−1)th control cycle. In the following, the subscripts (n) or (n−1) is added to a control cycle, indicating that the control cycle is a particular control cycle.

Subtracting unit 30 subtracts output voltage Vout from target voltage Vf in every control cycle, thereby calculating a voltage deviation U of output voltage Vout from target voltage Vf, which is, accordingly, indicated by $U(n)=Vf-Vout(n)$. The calculated voltage deviation $U(n)$ is input to FF control determination unit 10 and FR control variable calculator 40. In other words, output voltage Vout corresponds to one example of an "output of the power converter," and target voltage Vf corresponds to one example of a "target output of the power converter." Voltage deviation $U(n)$ corresponds to one example of a "deviation in output."

Figure 2:
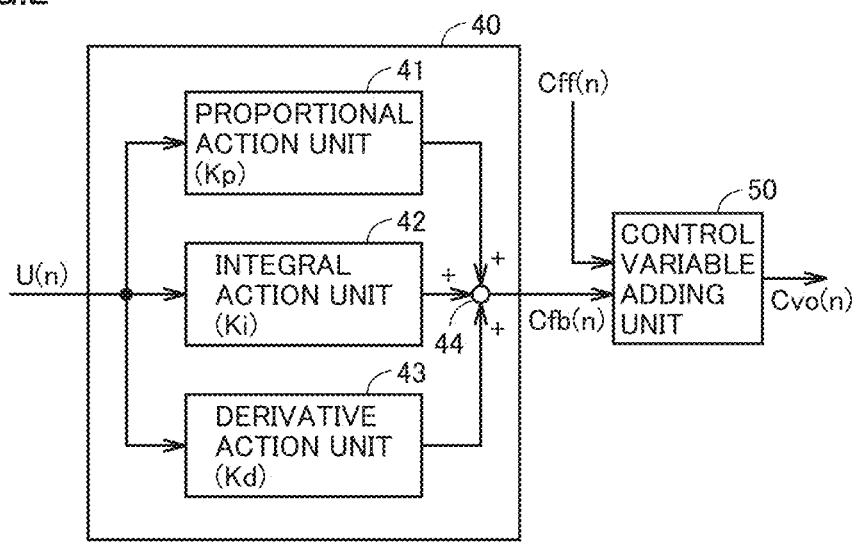
FIG. 2 is a functional block diagram illustrating a detailed configuration of a feedback (FB) controller shown in FIG. 1.

FIG. 2 is a functional block diagram further illustrating a configuration of FB control variable calculator 40.

Referring to FIG. 2, FR control variable calculator 40 has a proportional action unit 41, an integral action unit 42, a derivative action unit 43, and an adding unit 44.

Proportional action unit 41 outputs a product of a proportional gain Kp and voltage deviation $U(n)$ as a proportional control variable. Integral action unit 42 outputs a product of an integral value of voltage deviations $U(1)$ to $U(n)$ and an integral gain Ki as an integral control variable. Derivative action unit 43 outputs a product of a difference value between voltage deviations $U(n)$ and $U(n-1)$ and a derivative gain Kd as a derivative control variable.

Adding unit 44 adds the proportional control variable, the integral control variable, and the derivative control variable, thereby calculating a FB control variable Cfb. FB control variable $Cfb(n)$ is calculated in each control cycle and input to control variable adding unit 50.

Proportional gain Kp, integral gain Ki, and derivative gain Kd are held in input data file 110, as shown in FIG. 1. The gain values held in input data file 110 are loaded into FB control variable calculator 40 when. DC-to-DC converter 7 is in operation.

In the configuration example of FIG. 2, FB control variable calculator 40 implements the feedback control by a proportional integral differential (PID) control. However, the feedback control may be implemented by a different approach. The feedback control controls the steady characteristics of output voltage Vout relative to target voltage Vf. FB control variable calculator 40 corresponds to one example of a "feedback controller." FB control variable Cfb(n) corresponds to a "first control variable."

In contrast, an undershoot or overshoot of output voltage Vout is controlled by the feedforward control upon the initiation of operation of DC-to-DC converter 7 or when the load varies. FF control variable Cff(n) calculated by FF control variable calculator 20 of FIG. 1 is input to control variable adding unit 50.

Control variable adding unit 50 sums FB control variable Cfb(n) output from FB control variable calculator 40 and FF control variable Cff(n) output from FF control variable calculator 20, and sends a resultant of the summation, which is voltage control variable Cvo(n), to switching control signal generator 60.

In each control cycle, switching control signal generator 60 generates a control signal for DC-to-DC converter 7, according to voltage control variable Cvo(n). For example, DC-to-DC converter 7 is configured to control output voltage Vout by controlling a duty-ratio of a switching element (not shown), such as a transistor, included in DC-to-DC converter 7. In the present embodiment, suppose that an increase of the duty ratio of the switching element and voltage control variable Cvo increases output voltage Vout, and a decrease of the duty ratio decreases output voltage Vout. In this case, switching control signal generator 60 generates the control signal for DC-to-DC converter 7 so that the control signal has a raised duty ratio if voltage control variable Cvo is increased, and the control signal has a lowered duty ratio if voltage control variable Cvo is reduced.

As a result, the switching element included in DC-to-DC converter 7 is controlled between on an off in a duty ratio according to the control signal generated by switching control signal generator 60, thereby controlling output voltage Vout to target voltage Vf according to voltage control variable Cvo.

Figure 3:
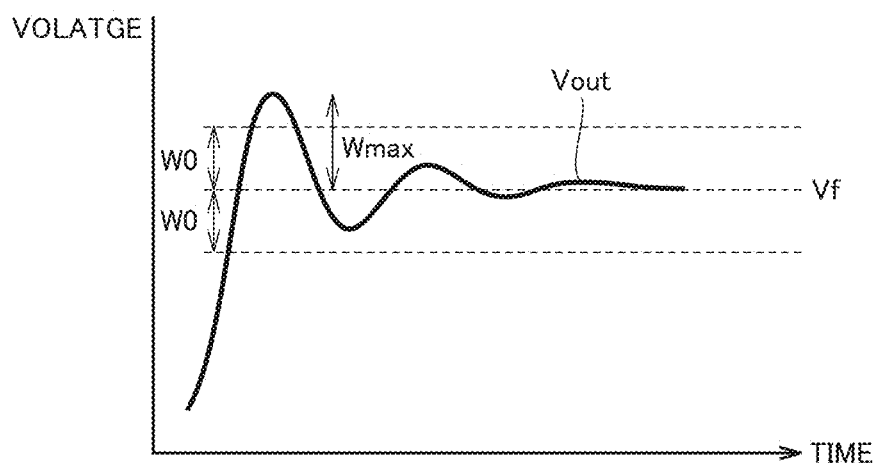
FIG. 3 is one example waveform diagram of an output voltage.

FIG. 3 shows one example waveform diagram of output voltage Vout.

Referring to FIG. 3, while output voltage Vout is in a transient state in which output voltage Vout is to be raised from zero to target voltage Vf, or output voltage Vout is deviated from target voltage Vf by a variation of the load is to be returned back to target voltage Vf, an overshoot (Vout>Vf) or an undershoot (Vout<Vf) occurs.

In a transient state involving raising of output voltage Vout, as shown in FIG. 3, output voltage Vout is maximized by an overshoot, after which the absolute value |Vout-Vf| of the voltage deviation attenuates and output voltage Vout settles to target voltage Vf. The maximum value of |Vout-Vf| at this time (i.e., |Vout-Vf| at an occurrence of the overshoot) is defined as a maximum amplitude Wmax.

In contrast to FIG. 3, in a transient state involving lowering of output voltage Vout, output voltage Vout is minimized by an undershoot, after which the absolute value |Vout-Vf| of the voltage deviation attenuates and output voltage Vout matches target voltage W. The maximum value of |Vout-Vf| at this time (i.e., |Vout-Vf| at an occurrence of the undershoot) is defined as a maximum amplitude Wmax.

The feedforward control is performed by FF control determination unit 10 and FF control variable calculator 20, shown in FIG. 1. In other words, the functionality of a "feedforward controller" can be implemented by FF control determination unit 10 and FF control variable calculator 20. Control device 5a according to the present embodiment performs the feedforward control to set maximum amplitude Wmax in the transient state to an allowable amplitude W0 or less.

Figure 4:
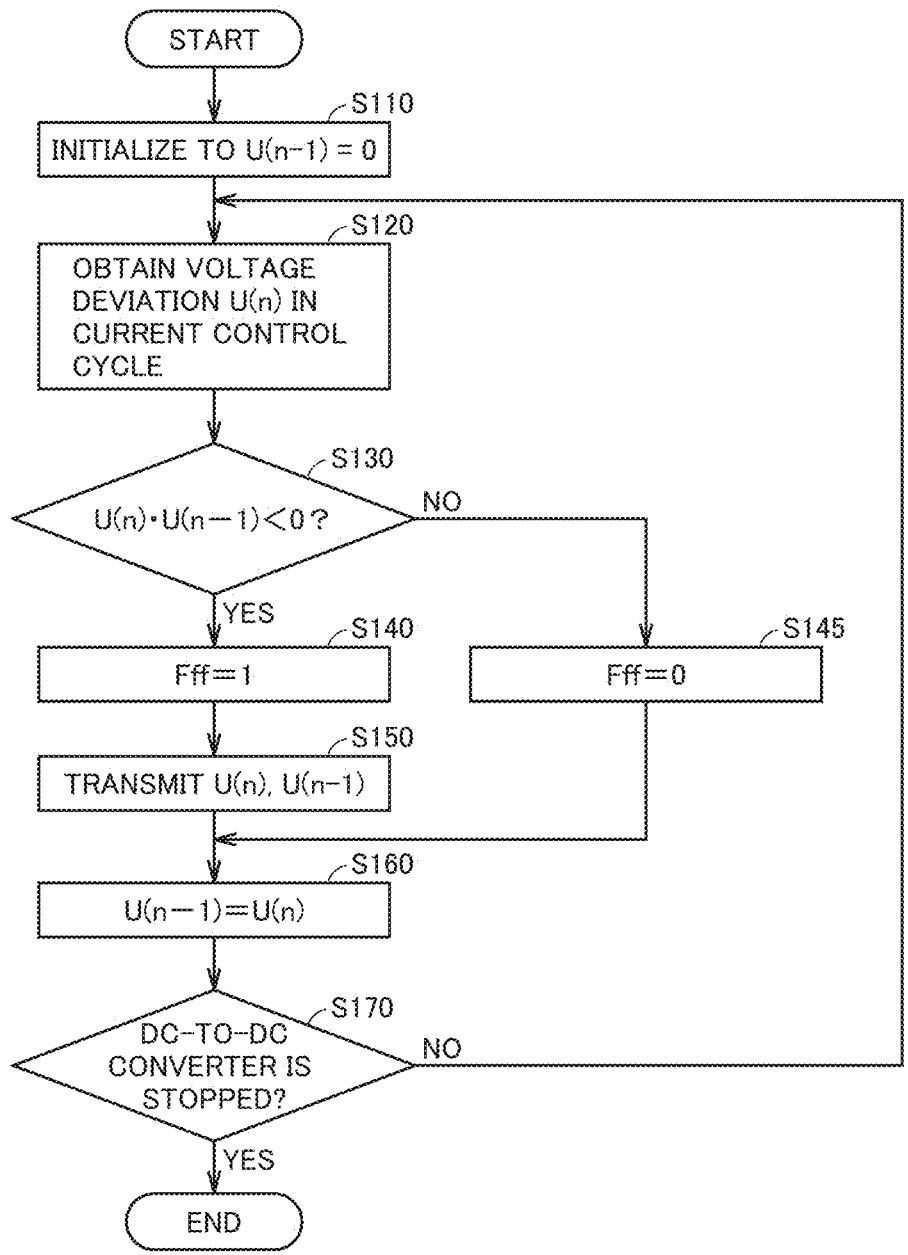
FIG. 4 is a flowchart illustrating a control process by a feedforward (FF) control determination unit shown in FIG. 1.

FIG. 4 shows a flowchart illustrating a control process by FF control determination unit 10.

Referring to FIG. 4, as DC-to-DC converter 7 starts the operation, FF control determination unit 10, in step S110, sets U(n−1)=0 as the initial settings for the start of the control (n=1). In step S120, FF control determination unit 10 obtains voltage deviation U(n) in the current control cycle from output of subtracting unit 30. In step S130, FF control determination unit 10 determines whether a product of voltage deviation U(n) in the current control cycle and voltage deviation U(n−1) in the immediately preceding control cycle is negative. In step S110, FF control determination unit 10 sets a FF control flag Fff (described below) ="0" as the initial settings.

Step S130 is determined to be YES if U(n−1)<0 and U(n)>0 or if U(n−1)>0 and U(n)<0, that is, if voltage deviations U(n) and U(n−1) have different polarities. Otherwise, step S130 is determined to be NO.

If voltage deviations U(n) and U(n−1) have different polarities (YES in S130), FF control determination unit 10 sets FF control flag Fff="1" in step S140 and transmits voltage deviations U(n) and U(n−1) to FF control variable calculator 20 in step S150. In step S160, FF control determination unit 10 sets U(n−1) U(n) for the subsequent control cycle.

In contrast, if voltage deviations U(n) and U(n−1) have the same polarity (NO in S130), FF control determination unit 10 sets FF control flag Fff="0" in step S145. The process skips step S150 and proceeds to step S160. Accordingly, in this case, voltage deviations U(n) and U(n−1) are not transmitted to FF control variable calculator 20.

FF control determination unit 10 repeats steps S120 through S160 for each period Δt (control cycle) until DC-to-DC converter 7 stops (if NO in S170).

Referring again to FIG. 1, FF control variable calculator 20 calculates FF control variable Cff, using FF control flag Fff and voltage deviations U(n) and U(n−1) output from FF control determination unit 10 and FF control gain β loaded from input data file 110 of FIG. 1.

Figure 5:
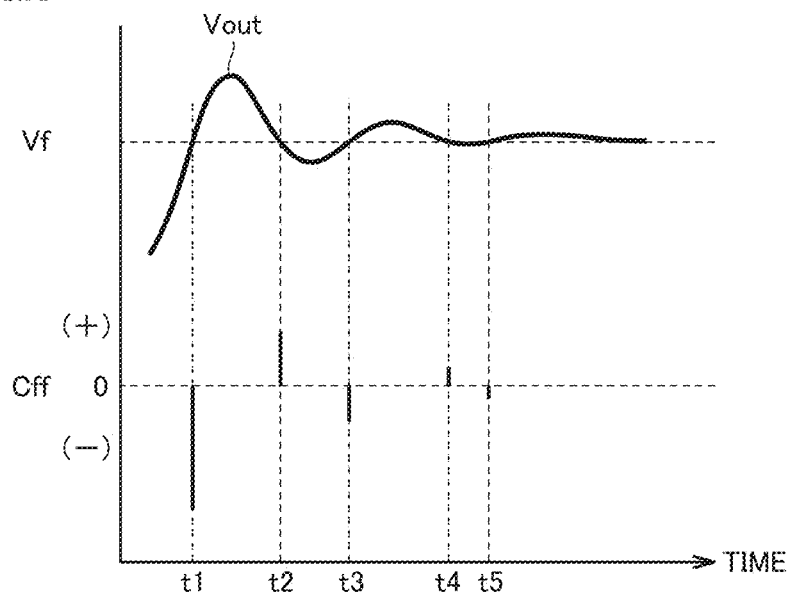
FIG. 5 is a schematic waveform diagram illustrating an example control operation of a FE control variable calculator shown in FIG. 1.

FIG. 5 shows a schematic waveform diagram illustrating an example control operation by FF control variable calculator 20.

Referring to FIG. 5, output voltage Vout crosses target voltage Vf at times t1, t2, t3, t4, and t5. Accordingly, Fff="1" is set in the control cycles corresponding to times t1 to t5, and Fff="0" is set in control cycles corresponding to the other times.

FF control variable calculator 20 calculates FF control variable Cff(n) according to Equation (1) in the control cycles where Fff="1," while FF control variable calculator 20 sets Cff(n)=0 in the control cycles where Fff="0."

$$Cf\!f(n)=\beta^*(U(n)-U(n-1)) \quad (1)$$

In other words, FF control variable Cff(n) corresponds to a "second control variable," voltage deviation U(n) corresponds to a "first voltage deviation," and voltage deviation U(n−1) corresponds to a "second voltage deviation."

As a result, Cff<0 is set in the control cycle corresponding to time t1 so that the control variable is set to lower the output voltage Vout to dampen the amplitude of the overshoot. In contrast, Cff>0 is set in the control cycle corresponding to time t2 so that the control variable is set to raise the output voltage Vout to dampen the amplitude of the undershoot.

Subsequently, Cff<0 is set in the control cycles corresponding to times t3 and t5, while Cff>0 is set in the control cycle corresponding to time t4. The rate of change of output voltage Vout gradually decreases over time, and |U(n)−U(n−1)| gradually decreases as a result. Accordingly, the absolute value Cff; of the FF control variable calculated at times t1 to t5 gradually decreases.

In control cycles other than those corresponding to times t1 to t5, Cff=0 is set and output voltage Vout is controlled by a feedback control. In other words, in response to output voltage Vout crossing the target voltage Vf, the feedforward control acts to prevent a change (increase or reduction) in output voltage Vout at the time of the crossing.

In this way, according to the DC-to-DC converter control device of Embodiment 1, output voltage Vout can be matched to target voltage Vf and the overshoot and the undershoot in the transient state can be suppressed, without involving an attenuation operation of the FF control gain and a machine learning operation for each control cycle as in PTL 1.

Next, settings of FF control gain β for use in the feedforward control be described in detail. In the DC-to-DC converter control device according to Embodiment 1, FF control gain β is set through neural network learning by learning controller 120.

While DC-to-DC converter 7 is in operation, learning data creator 130, shown in FIG. 1, collects operational data for use in the neural network learning.

Figure 6:
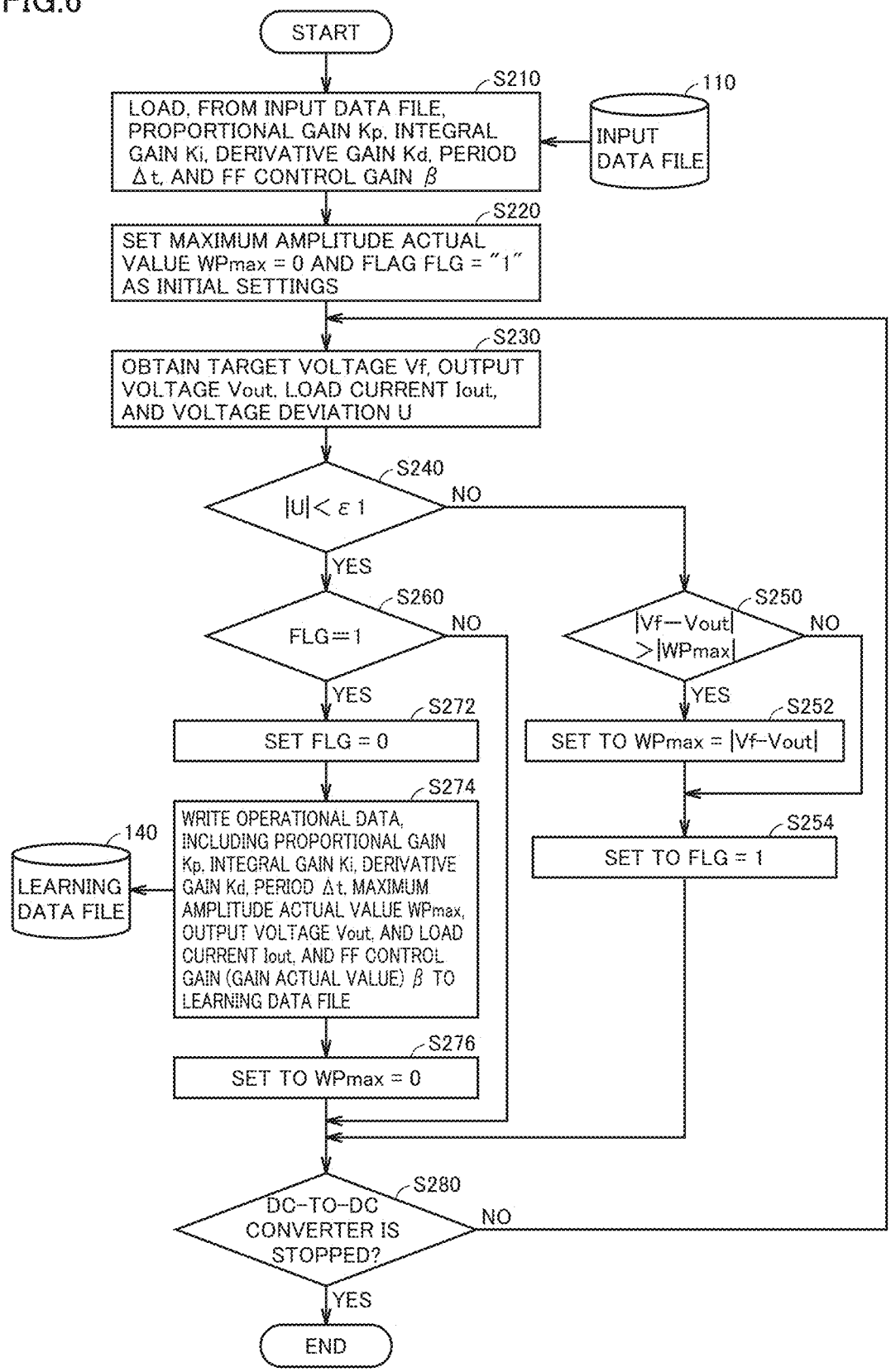
FIG. 6 is a flowchart illustrating a data collection process by a learning data creator shown in FIG. 1.

FIG. 6 is a flowchart illustrating a data collection process by learning data creator 130.

Referring to FIG. 6, as DC-to-DC converter 7 starts the operation, learning data creator 130, in step S210, loads, from input data file 110, proportional gain Kp, integral gain Ki, derivative gain Kd, a period (control cycle) Δt, and FF control gain β, which are for use in control. In step S220, learning data creator 130 sets a maximum amplitude actual value WPmax=0 and collection flag FLG="1" as the initial settings for the data collection. While DC-to-DC converter 7 is in operation, voltage controller 100 controls output voltage Vout according to the control cycle and the gain values loaded in step S210.

While DC-to-DC converter 7 is in operation, learning data creator 130 obtains target voltage Vf, output voltage Vout, load current Iout, and voltage deviation U=Vf-Vout) at this timing in step S230, and determines, in step S240, whether the absolute value |U| of the voltage deviation obtained in step S230 is less than ε1. Note that ε1 is a predetermined reference value which is used to determine whether output voltage Vout is settled to target voltage Vf.

If |U|≥ε1 (NO in S240), learning data creator 130, in step S250, determines whether the absolute value |Vf−Vout|, which is a difference between output voltage Vout obtained in step S230 and target voltage Vf, is greater than the absolute value |WPmax| of the current maximum amplitude actual value.

If |Vf-Vout|>|WPmax| (YES in S250), learning data creator 130 updates maximum amplitude actual value WPmax to maximum amplitude actual value WPmax=|Vf−Vout| in step S252. Learning data creator 130 maintains collection flag FLG="1" in step S254.

If |Vf-Vout|≤|WPmax| (NO in S250), the process skips step S252 and proceeds to step S254. Accordingly, maximum amplitude actual value WPmax is maintained at the current value and collection flag FLG="1" is maintained.

In contrast, if |U|<ε1 (YES in S240), learning data creator 130 determines whether collection flag FLG="1" in step S260. If collection flag FLG="1" (YES in S260), that is, if the conditions |U|≥ε1 has changed to |U|<ε1, learning data creator 130 sets collection flag FLG="0" in step S272, and writes the current operational data and FF control gain β as learning data to learning data file 140 in step S274.

For example, the operational data includes seven data items: proportional Kp, integral gain Ki, derivative gain Kd, period Δt, which are control parameters loaded in step S210, and the current output voltage Vout, load current Iout, and maximum amplitude actual value WPmax. As the current maximum amplitude actual value WPmax is written to learning data file 140, learning data creator 130 initializes to WPmax=0 in step S276.

Note that if FLG="0" (NO) in step S260, the process skips steps S272 through S276. In other words, if |U|<ε1 continues, no learning data is written to learning data file 140.

Learning data creator 130 repeats steps S230 through S276 until DC-to-De converter 7 stops (NO in S280). Preferably, the cycle of the repetition is equal to control cycle Δt by voltage controller 100.

In steps S230 through S276, maximum amplitude actual value WPmax is extracted in steps S250 to S254 during an unsteady period (FLG="1") in which output voltage Vout is not settled to target voltage Vf. As the unsteady period transitions to a steady period (FLG="0") in which output voltage Vout has settled to target voltage Vf, maximum amplitude actual value WPmax in the unsteady period and the other operational data and FF control gain β are collected and written to learning data file 140. In other words, each time step S274 is performed in response to the transition from an unsteady period to a steady period, one set of learning data, consisting of the operational data, including maximum amplitude actual value WPmax, and FF control gain β, is collected. The value of FF control gain β at this time corresponds to an "actual gain value."

Accordingly, while DC-to-DC converter 7 is in operation, multiple sets of learning data as mentioned above can be collected and stored in learning data file 140. In the following, suppose that J sets (J: an integer greater than or equal to 2) of learning data are collected by learning data creator 130 and stored in learning data file 140.

Learning data processor 150 calculates FF control gain β while loading and sending to/from learning data file 140, neural network data file 160, and input data file 110. The calculated FF control gain β is written to input data file 110 and used for the feedforward control by voltage controller 100 while DC-to-DC converter 7 is in operation.

Figure 7:
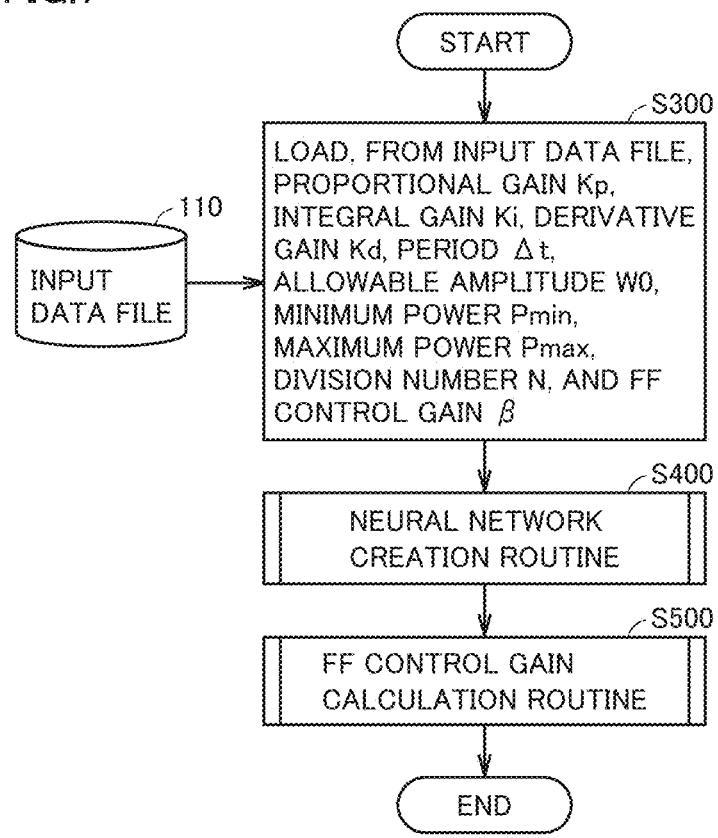
FIG. 7 is a first flowchart illustrating a FF control gain calculation process by a learning data processor shown in FIG. 1.

FIG. 7 is a flowchart illustrating a FF control gain calculation process by learning data processor 150.

Referring to FIG. 7, in step S300, learning data processor 150 loads proportional gain Kp, integral gain Ki, derivative gain Kd, period (control cycle) Δt, and allowable amplitude W0, a minimum power Pmin, a maximum power Pmax, and a division number N from input data file 110.

Minimum power Pmin and maximum power Pmax can be set in correspondence with the range of the rated power of DC-to-DC converter 7. Allowable amplitude W0 corresponds to an allowable upper limit of maximum amplitude Wmax.

In step S400, using the learning data stored in learning data file 140, learning data processor 150 creates a neural network. The functionality of a "first calculator" is implemented by step S400.

In step S500, using the neural network created in step S400, learning data processor 150 calculates FF control gain β so that Wmax (WPmax)≤W0. Division number N is a predetermined integer used in the calculation process of step S500. The functionality of a "second calculator" is implemented by step S500.

Figure 8:
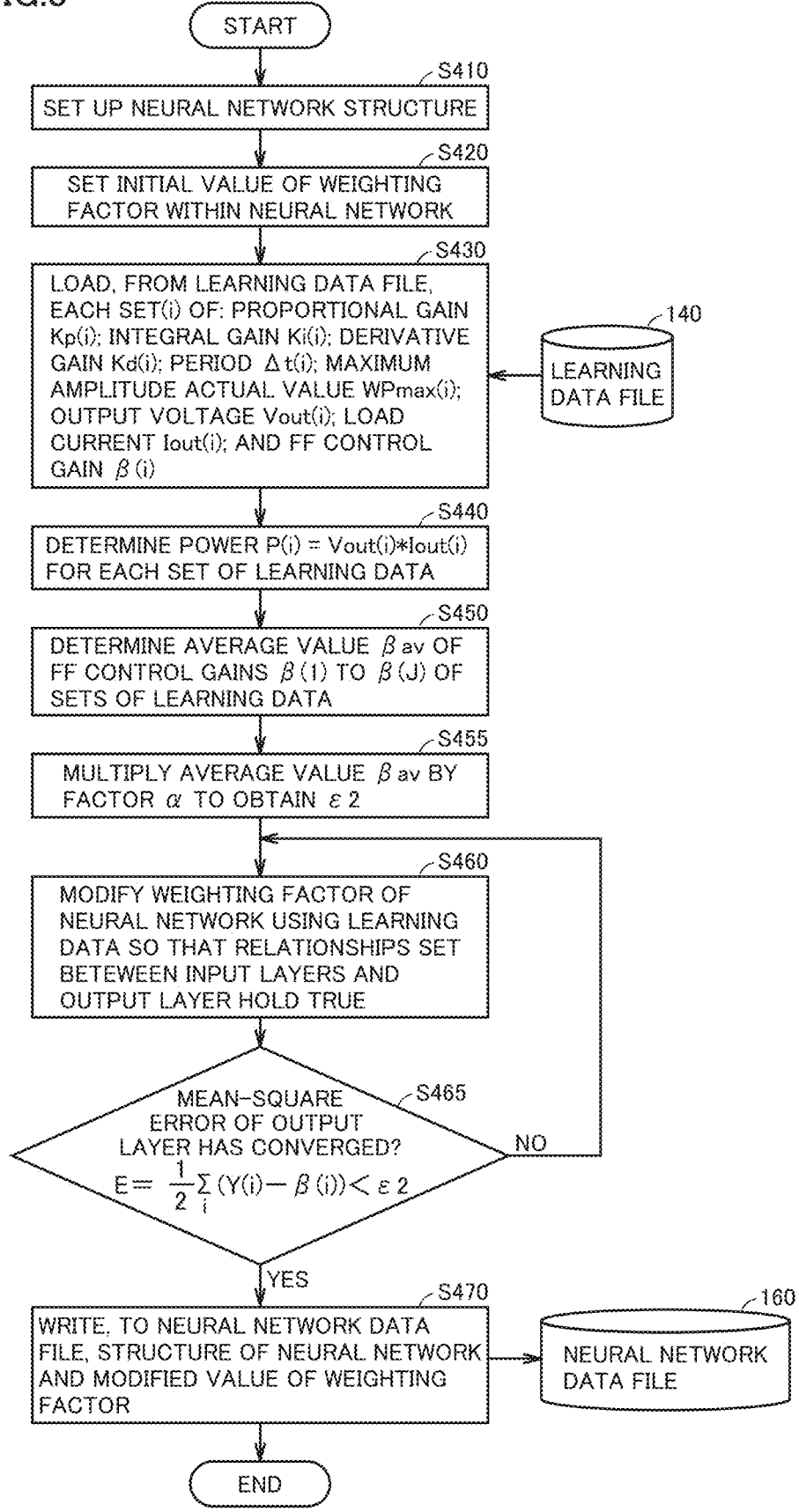
FIG. 8 is a flowchart illustrating details of a neural network creation routine shown in FIG. 7.

FIG. 8 shows a flowchart illustrating details of the neural network creation routine in step S400.

Referring to FIG. 8, learning data processor 150 sets up a neural network structure in step S410 and sets an initial value of a weighting factor within the neural network in step S420.

Figure 9:
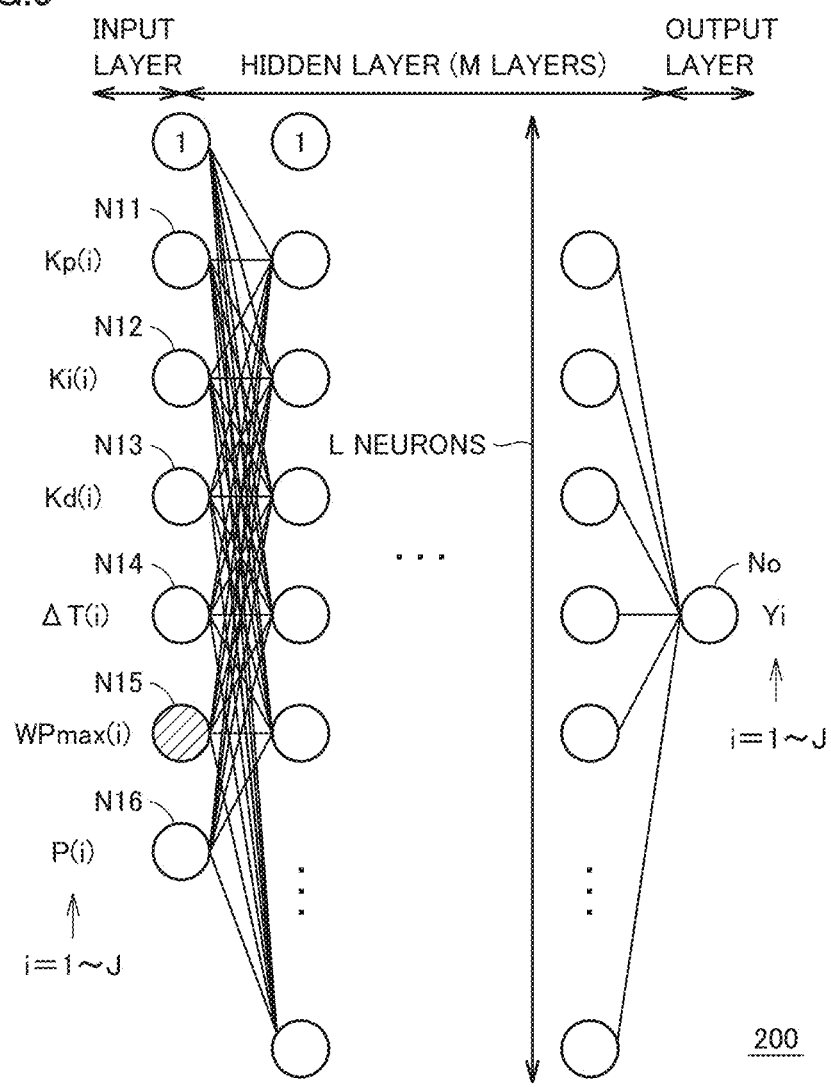
FIG. 9 is a schematic diagram illustrating one example neural network structure.

FIG. 9 shows one example neural network structure.

Referring to FIG. 9, a neural network 200 includes Ka neurons (Ka: an integer greater than or equal to 2) constituting an input layer, Kb neurons No (Kb: natural number) constituting an output layer, and multiple neurons constituting a hidden layer connected between the input layer and the output layer. In the example of FIG. 9, Ka=6 and Kb=1. Thus, neurons N11 to N16 are disposed on the input layer and one neuron No is disposed on the output layer.

The hidden layer consists of up to L neurons interconnected across M layers (M, L: an integer greater than or equal to 2). The above-mentioned parameters K1, K2, M, and L are determined in step S410, and thereby the structure of neural network 200 is set up. For the neurons represented by circles in FIG. 9, the neurons represented with "1" have a bias value input thereto, and the other neurons have an activation function input thereto. For example, a sigmoid function may be employed as the activation function. However, any well-known activation function can be employed. As such, the structure of neural network 200 is set up by the number of input layers, hidden layers, and output layers, and the number of neurons included in each layer.

Figure 10:
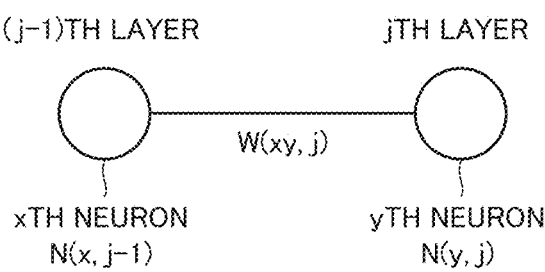
FIG. 10 is a schematic diagram illustrating a weighting factor between neurons.

FIG. 10 shows a schematic diagram illustrating a weighting factor between neurons.

Referring to FIG. 10, for the neurons connected one another within neural network 200, a weighting factor is set to each connection between two neurons. In the example of FIG. 10, a weighting factor W(xy, j) is set between the x-th neuron N (x, j−1) of the (j−1)th layer and the y-th neuron N(y, j) of the j-th layer connected to each other.

Note that neuron N (x, j−1) is also connected to other neuron(s) of the j-th layer and the (j−2)th layer, and a separate weighting factor is set between these other neuron (s). Similarly, neuron N (y, j) is also connected to other neuron(s) of the (j−1)th layer and the (j+1)th layer, and a separate weighting factor is set between these other neuron (s). In step S420, the initial value of each weighting factor is set, for example, using a random number.

Referring again to FIG. 8, in step S430, learning data processor 150 loads J sets of learning data stored in learning data file 140. In the present embodiment, proportional gain Kp(i), integral gain Ki(i), derivative gain Kd(i), period Δt(i), output voltage Vout(i), load current Iout(i), maximum amplitude actual value WPmax(i), and FF control gain β(i) are loaded as the learning data for i=1 to J. In other words, the subscript (i) is appended to the set of learning data to distinguish that the set is the i-th set (i=1 to J) of learning data.

In step S440, learning data processor 150 determines a power P(i) for each set of learning data. Specifically, power P(i) is calculated by the equation: P(i)=Vout(i)*Iout(i). In step S450, learning data processor 150 calculates an average value Pav of FF control gains β(1) to β(J) of the sets of learning data by weighted averaging. In step S455, learning data processor 150 multiplies average value βav by a predetermined factor α, thereby setting a determination value ε2 (ε2=βav*α), which is used for a convergence determination in step S465 described below. For example, α=0.01 can be set.

In step S460, learning data processor 150 performs a weighting factor modification operation on neural network 200 (S410).

Referring again to FIG. 9, the learning data is input to neurons N11 to N16 included in the input layer of neural network 200. In the example of FIG. 9, output voltage Vout(i) and load current Iout(i), included in the learning data, are input to the input layer as power P(i). In other words, in the present embodiment, the collected learning data may be set, as is, to the input layer, or may be processed by computation using, for example, a predetermined constant or other learning data and set to the input layer.

Having the input layer being set up as the above, the value of each weighting factor is modified so that the value of neuron No of the output layer matches the FF control gain (i.e., an "actual gain value") β(i). For example, backpropagation can be employed to modify the weighting factors. However, any well-known approach can be employed. As step S460 is performed on each set of learning data (i=1 to J), convergence determination is performed in step S465.

In step S465, learning data processor 150 determines whether a summation E of value Y(i) of the output layer and the squared error of FF control gain β (i) for each set (i=1 to J) of learning data is less than determination value ε2 set in step S455. In other words, in step S455, learning data processor 150 determines whether Equation (2) below holds true. The letter "Σ" in Equation (2) indicates the summation for i=1 to J.

$$E=(1/2)*\Sigma(Y(i)-\beta(i))<\varepsilon 2 \quad (2)$$

Learning data processor 150 repeats modifying the weighting factor in step S460 until (NO in S465) the convergence determination according to Equation (2) holds true. As the convergence determination holds true (YES in S465), the structure of neural network 200 (i.e., the number of input layers, hidden layers, output layer, and the number of neurons of each layer) and data indicating the convergence value of the weighting factor at the connection between neurons are written to neural network data file 160 in step S470.

As such, as the neural network creation routine in step S400 (FIG. 7) ends, a FF control gain calculation routine in step S500 (FIG. 7) is subsequently performed.

Figure 11:
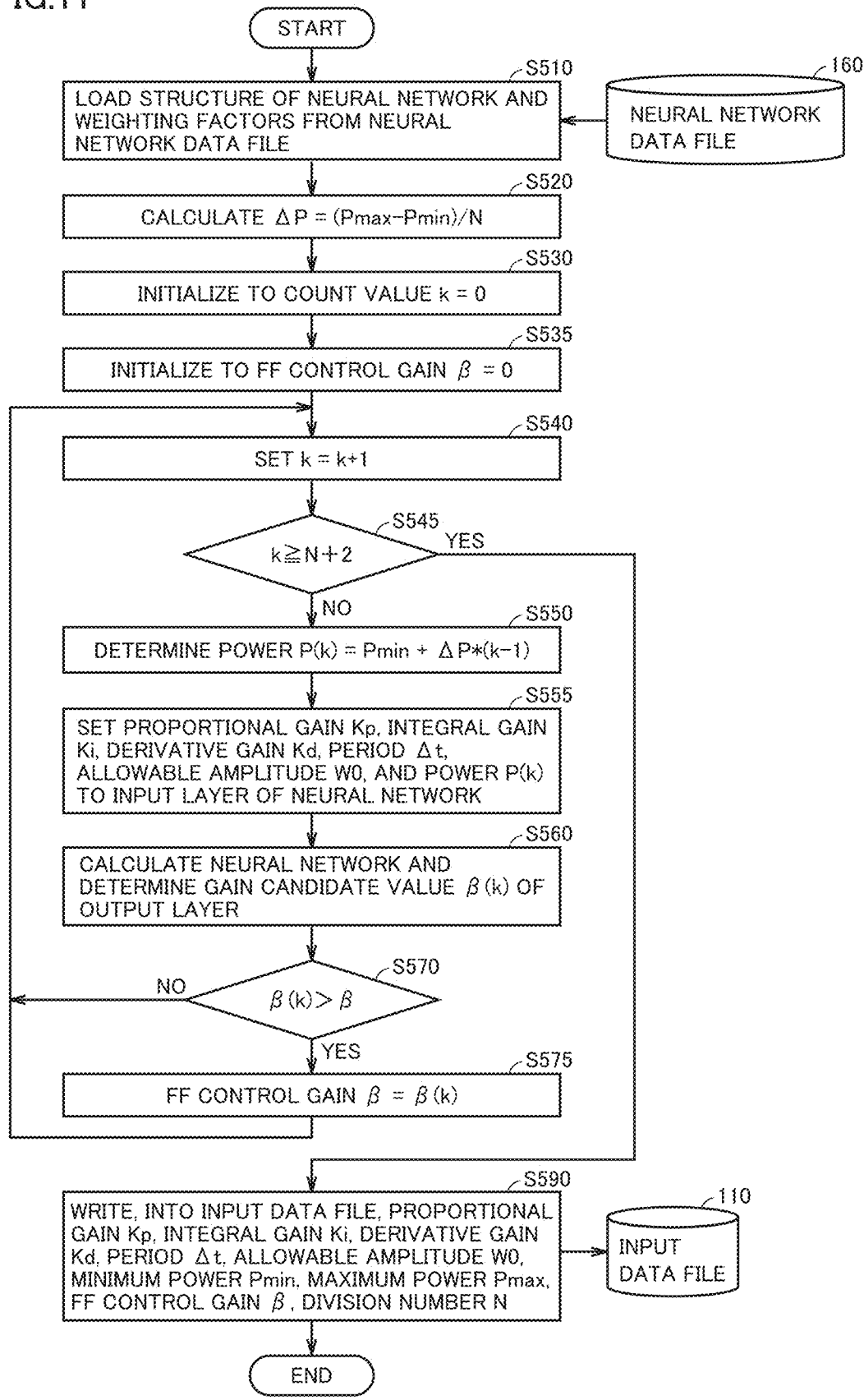

FIG. 11 shows a flowchart illustrating details of the FF control gain calculation routine.

Referring to FIG. 11, in step S510, learning data processor 150 loads, from neural network data file 160, the structure of neural network 200, and the data indicating the weighting factors which are determined in the neural network creation routine.

Considering the fact that the rate of change of the voltage in an unsteady period changes according to a power level, learning data processor 150 calculates FF control gain β separately at multiple power levels. For this reason, in step S520, learning data processor 150 calculates a step of power ΔP for the computation of FF control gain β by Equation (3), using maximum power Pmax, minimum power Pmin, and division number N loaded in step S300 (FIG. 7).

$$\Delta P=(P\max-P\min)/N \quad (3)$$

Learning data processor 150 initializes a count value k to count value k=0 in step S530, and initializes FF control gain β to FF control gain β=0 in step S535.

As learning data processor 150 increments count value k by 1 in step S540, learning data processor 150 determines whether count value k has reached (N+2) in step S545. If k<(N+2) (NO in S545), a power P(k) for the current count value k is calculated by Equation (4) below in step S550. It is understood that P(1)=Pmin and P(k+1)=Pmax from Equation (4).

$$P(k)=Pmin+(k-1)*\Delta P \quad (4)$$

In steps S555 and S560, learning data processor 150 calculates a gain candidate value β(k) of the FF control gain, using neural network 200 loaded in step S510.

Figure 12:
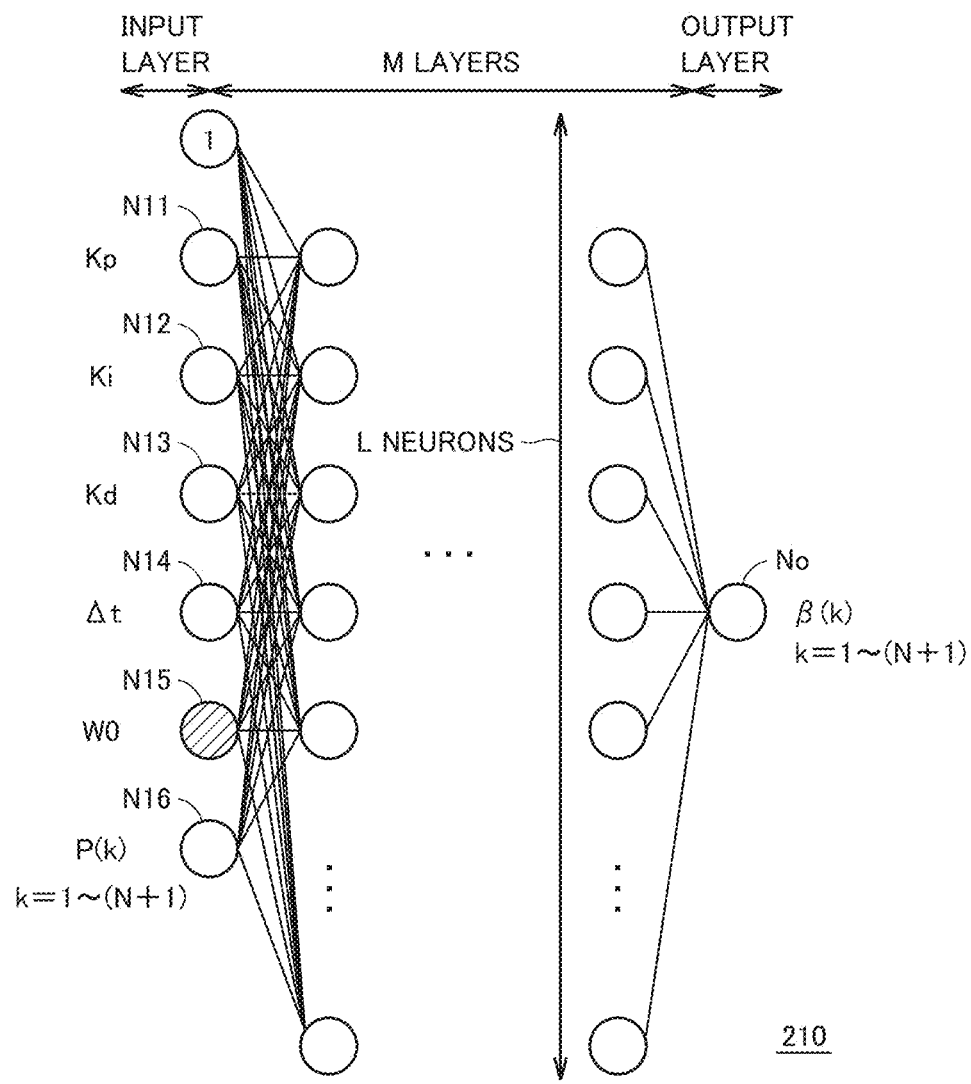
FIG. 12 is a schematic diagram illustrating a neural network structure employed in the FF control gain calculation routine.

FIG. 12 shows a schematic diagram illustrating a neural network structure used in the FF control gain calculation routine.

Referring to FIG. 12, neural network 200 has the same structure as that shown in FIG. 9, and the weighting factor between neurons is set to the value (convergence value) determined in the neural network creation routine (FIG. 8).

In step S555, as with FIG. 9, proportional gain Kp, integral gain Ki, derivative gain Kd, and period Δt are set to the values input in step S300 for neurons N11 to N14, among neurons N11 to N16 of the input layer. P(k) calculated in step S550 is input to neuron N16 as the same power P with FIG. 9.

Furthermore, allowable amplitude W0, input in step S300, is input to neuron N15, in place of maximum amplitude actual value WPmax of FIG. 9. As a result, in step S560, gain candidate value β(k), which allows maximum amplitude Wmax to be allowable amplitude W0, is obtained in neuron No of the output layer when DC-to-DC converter 7 is in operation using the operational data set to neurons N11 to N14, N16.

In step S570, as gain candidate value β(k) is obtained, learning data processor 150 compares β(k) and FF control gain β initialized in step S535. If β(k)>β (YES in S570), learning data processor 150 updates to β=β(k), and the process returns to step S540. In contrast, if β(k)≤β (NO in S570), the process skips step S575 and returns to step S540, without FF control gain β being updated.

In step S540, count value k is incremented by 1 from the current value, and the determination is made in step S545. This performs steps S545 through S575 for N times while k=1 to N+1 until step S545 is YES.

As a result, gain candidate value β(k) is calculated for each power P(k) (k: 1 to N+1) that is incremented by ΔP each time in the range from Pmin to Pmax, and the maximum value among gain candidate values β(k) is extracted and FF control gain β is set thereto.

As learning data processor 150 has finished N times of iteration of the computation (YES in S545), the process proceeds to step S590, and learning data processor 150 writes, to input data file 110, FF control gain β in combination with the operational data, including proportional gain Kp, integral gain. Ki, derivative gain Kd, period Δt, allowable amplitude W0, maximum power Pmax, and minimum power Pmin. This sets maximum amplitude Wmax to allowable amplitude W0 or less when DC-to-DC converter 7 is in operation using the above operational data. Thus, FF control gain β can be set.

Voltage controller 100 loads proportional gain Kp, integral gain Ki, derivative gain Kd, period Δt, and FF control gain β from input data file 110 upon the initiation of operation of DC-to-DC converter 7, and thus can control output voltage Vout as appropriate.

As such, in the DC-to-DC converter control device according to Embodiment 1, FF control gain β for use in the feedforward control described with reference to FIGS. 1 to 5 can be set using the neural network, so that maximum amplitude Wmax is allowable amplitude W0 or less.

In particular, using the learning data that is collected by learning data creator 130 when DC-to-DC converter 7 is in operation, learning data processor 150 can perform the neural network creation process (S400) and the FF control gain calculation process (S500) while DC-to-DC converter 7 is stopped. Thus, the computational load can be reduces, as compared to PTL 1 which requires a machine learning operation for each control cycle. Note that while at least some of the processing of steps S400, and S500 can be performed while DC-to-DC converter 7 is in operation, preferably, the neural network creation (S400), involving the iterative calculation involving the convergence determination, is performed while DC-to-DC converter 7 is stopped.

Variation of Embodiment 1

In a variation of Embodiment 1, a variation of the FF control gain calculation process (S500) by learning data processor 150 will be described.

Figure 13:
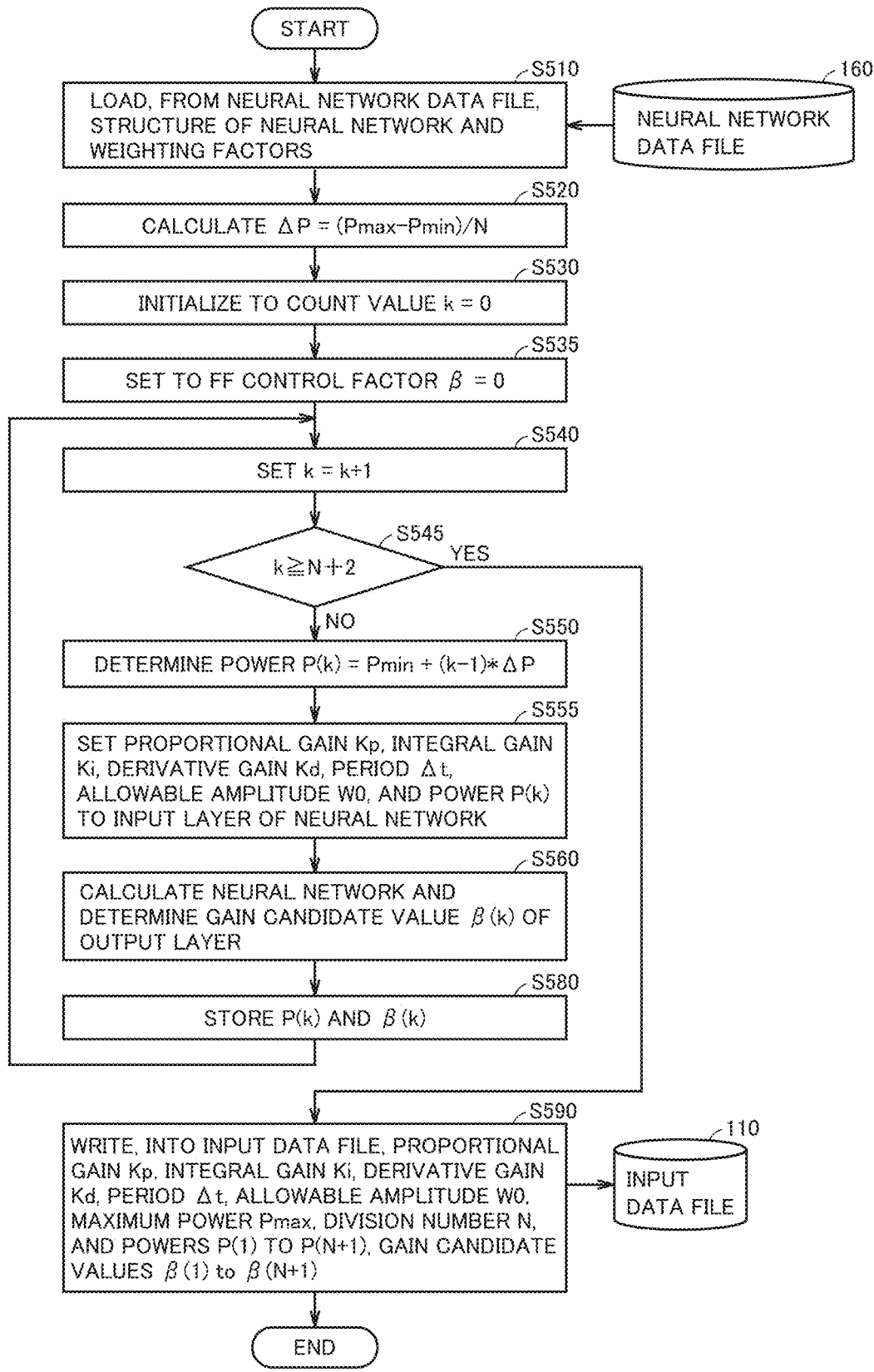
FIG. 13 is a flowchart illustrating the FF control gain calculation routine in a. DC-to-DC converter control device according to a variation of Embodiment 1.

FIG. 13 is a flowchart illustrating a FF control gain calculation routine in a DC-to-DC converter control device according to the variation of Embodiment 1. In other words, in the variation of Embodiment 1, the flowchart shown in FIG. 13 is carried out for step S500 (the FF control gain calculation routine) of FIG. 8, in place of the flowchart of FIG. 11.

Referring to FIG. 13, learning data processor 150 performs steps S510 to S560, Which are the same as those in FIG. 11, and, subsequently to step S560, performs step S580, and the process then returns to step S540.

In step S580, learning data processor 150 stores power P(k) and gain candidate value β(k) corresponding to the current count value k for each iteration. Accordingly, powers P(1) to P(N+1) and gain candidate values β(1) to P(N+1) are stored through steps S510 to S580.

As learning data processor 150 has finished N times of iteration of the computation (YES in S545), learning data processor 150 writes, to input data file 110, powers P(1) to P(N+1) and gain candidate values β(k) in step S590, in addition to proportional gain Kp, integral gain Ki, derivative gain Kd, period Δt, allowable amplitude W0, maximum power Pmax, and minimum power Pmin.

In this way, in the variation of Embodiment 1, gain candidate values β(1) to β(N+1) for setting maximum amplitude Wmax to allowable amplitude W0 or less at respective powers P(1) to P(N+1) in the range from Pmin to Pmax are written to input data file 110. This allows creation of a map for setting FF control gain β in input data file 110.

Figure 14:
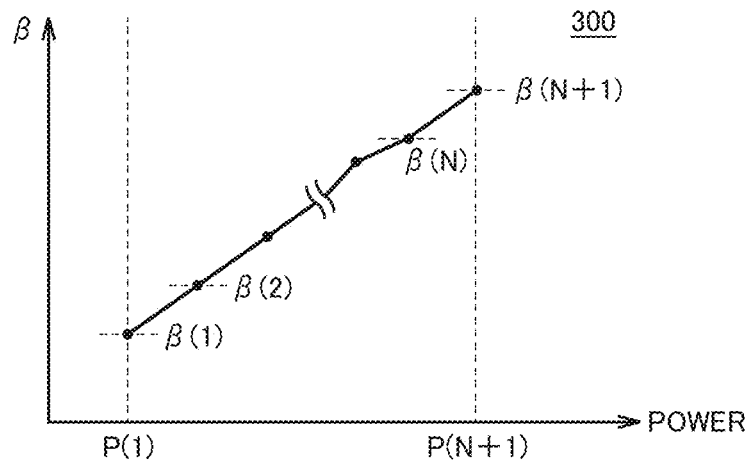
FIG. 14 is a schematic diagram illustrating a FF control gain setting map in the DC-to-DC converter control device according to the variation of Embodiment 1.

Referring to FIG. 14, a map 300 can be configured by plotting gain candidate values β(1) to β(N+1) in powers P(1) to P(N+1). On map 300, P(1) to P(N+1) cover the range from minimum power Pmin to maximum power Pmax. Intermediate power values between β(k) and β(k+1) can be set to intermediate values between gain candidate values β(k) and β(k+1) by linear interpolation.

Upon the initiation of operation of DC-to-DC converter 7, voltage controller 100 loads the configuration data of map 300, besides proportional gain Kp, integral gain Ki, derivative gain Kd, and period Δt, from input data file 110. Furthermore, FF control variable calculator 20 included in voltage controller 100 performs a feedforward control through a control process illustrated in a flowchart of FIG. 15.

Figure 15:
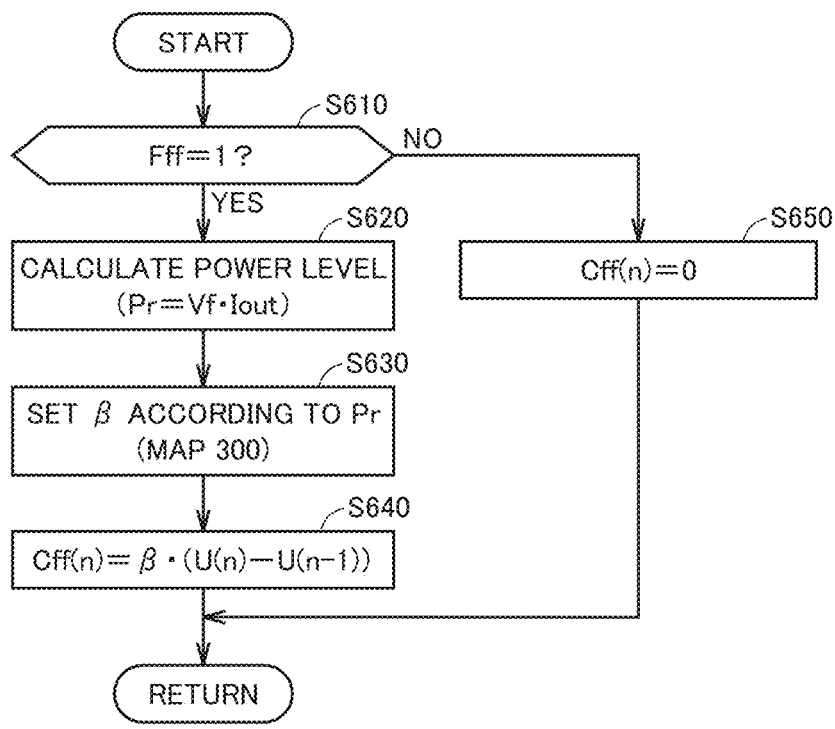
FIG. 15 is a flowchart illustrating a control process by a FF control variable calculator included in the DC-to-DC converter control device according to the variation of Embodiment 1.

Referring to FIG. 15, FF control variable calculator 20 starts step S610 in each control cycle each time period Δt has elapsed. In step S610, FF control variable calculator 20 determines whether FE control flag Fff output from FF control determination unit 10 holds FF control flag Fff="1." If Fff="0" (NO in S610), FF control variable calculator 20 sets FF control variable Cff(n)=0 in step S650.

In contrast, if Fff="1" (YES in S610), FF control variable calculator 20, in step S620, multiplies target voltage Vf by load current Iout to calculate the current power level Pr. In step S630, FF control variable calculator 20 refers to map 300 and sets FF control gain using power level. Pr calculated in step S620.

In step S640, FF control variable calculator 20 calculates FF control variable Cff(n) according to Equation (1), using FE control gain set in step S630 (Cff(n)=β*(U(n)−U(n−1)).

The variation of Embodiment 1 is the same as Embodiment 1, except for the way of setting the FF control gain. Thus, detailed description of the variation of Embodiment 1 will not be repeated. As such, in the variation of Embodiment 1, the FF control gain that is set using map 300 can be used to perform the same feedforward control as Embodiment 1. Note that the functionality described in Embodiment 1 can be implemented by FF control variable calculator 20 skipping step S620 and using a fixed value loaded from input data file 110 as FF control gain β in step S630 in the flowchart of FIG. 15.

As a result, according to the control device of the variation of Embodiment 1, the value of the FF control gain can be changed as appropriate according to a change in power level of DC-to-DC converter 7. Thus, in addition to the advantageous effects of Embodiment 1, an overshoot and an undershoot can be suppressed by the feedforward control even when DC-to-DC converter 7 is in operation in a wide power range.

Embodiment 2

Figure 16:
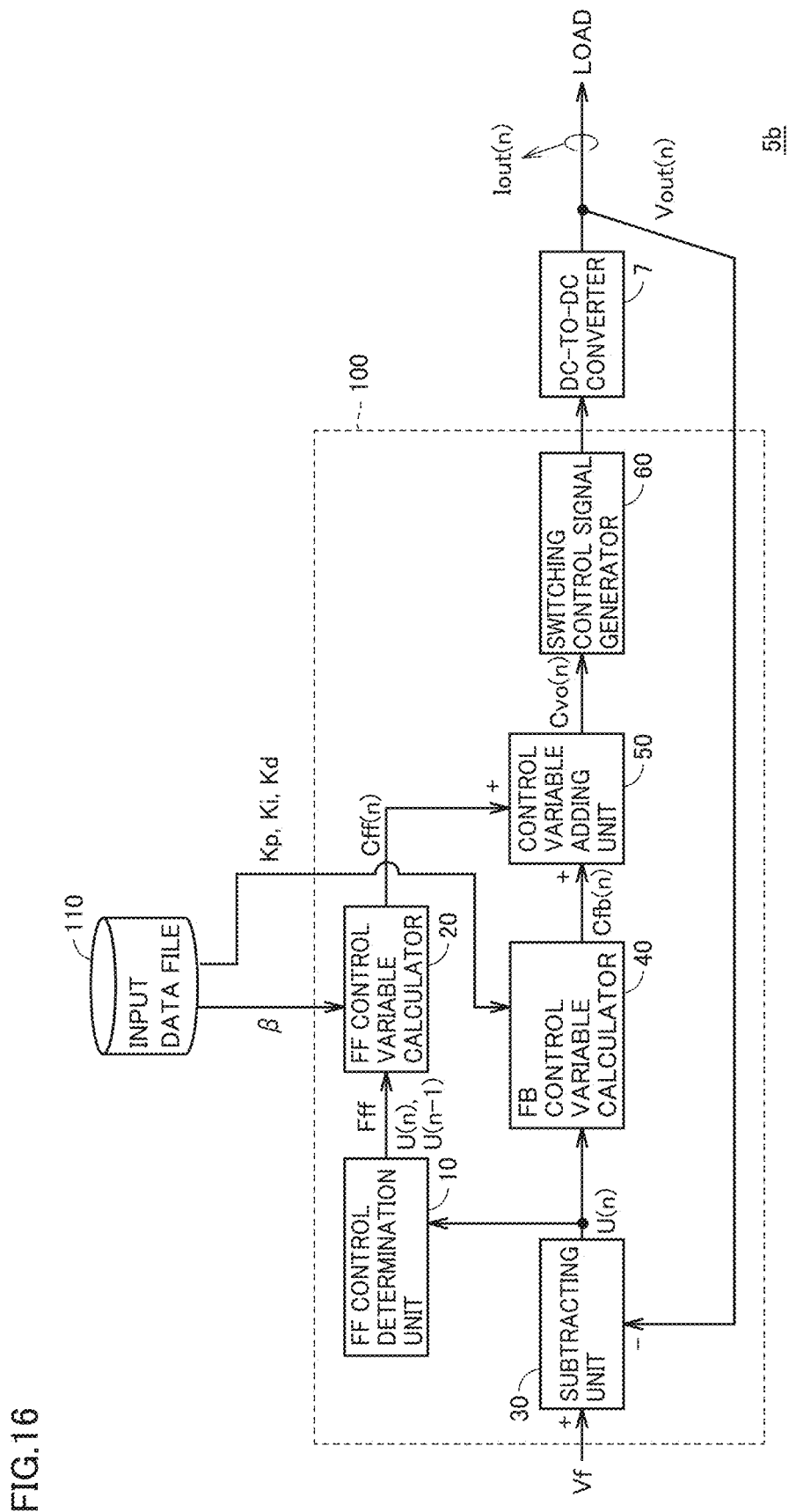
FIG. 16 is a functional block diagram illustrating a configuration of a DC-to-DC converter control device according to Embodiment 2.

FIG. 16 is a functional block diagram illustrating a configuration of a DC-to-DC converter control device according to Embodiment 2.

Referring to FIG. 16, a DC-to-DC converter control device 5b according to Embodiment 2 includes a voltage controller 100 and an input data file 110. Voltage controller 100 is configured in the same manner as Embodiment 1, and controls output voltage Vout of DC-to-DC converter 7 to target voltage Vf by combining the feedback control described with reference to FIG. 2 and the feedforward control described with reference to FIGS. 4 and 5.

In Embodiment 2, FF control gain β in the feedforward control is set to a predetermined gain value written in input data file 110. In other words, the output voltage control by a combination of the feedback control and the feedforward control, in which voltage controller 100 calculates a FF control variable only in a control cycle in which the polarity of voltage deviation U(n) is inverted, and sets the FF control variable at zero in other control cycles, can be implemented without limiting the method of calculation of FF control gain β.

Embodiment 3

The feedforward control according to Embodiment 1 calculates the FF control variable only for one cycle (i.e., the current control cycle) in which crossing of target voltage Vf and output voltage Vout is detected. However, in Embodiment 3, a feedforward control will be described which calculates FF control variables for multiple control cycles, using the crossing as a trigger.

Figure 17:
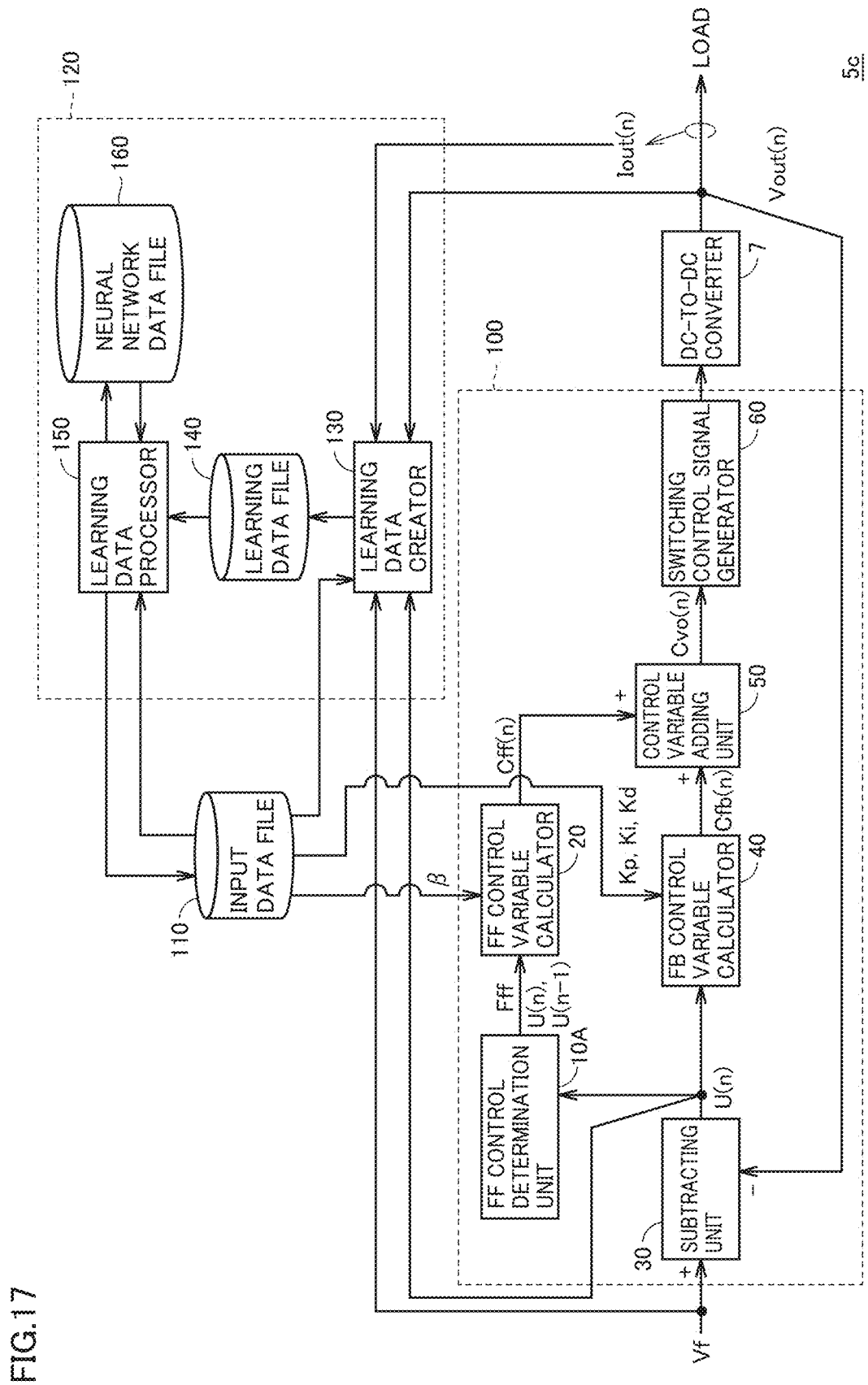
FIG. 17 is a functional block diagram illustrating a DC-to-DC converter control device according to Embodiment 3.

FIG. 17 is a functional block diagram illustrating a configuration of a DC-to-DC converter control device according to Embodiment 3.

Referring to FIG. 17, a DC-to-DC converter control device 5c according to Embodiment 3 is the same as DC-to-DC converter control device 5a according to Embodiment 1 (FIG. 1), except for including a FF control determination unit 10A, in place of FF control determination unit 10. The other configuration of DC-to-DC converter control device 5c is the same as DC-to-DC converter control device 5a, and thus the detailed description of DC-to-DC converter control device 5c will not be repeated. Accordingly, DC-to-DC converter control device 5c according to Embodiment 3 is the same as Embodiment 1 except for the FF control variable Cff(n) calculation process. The other control computations are the same as Embodiment 1.

Figure 18:
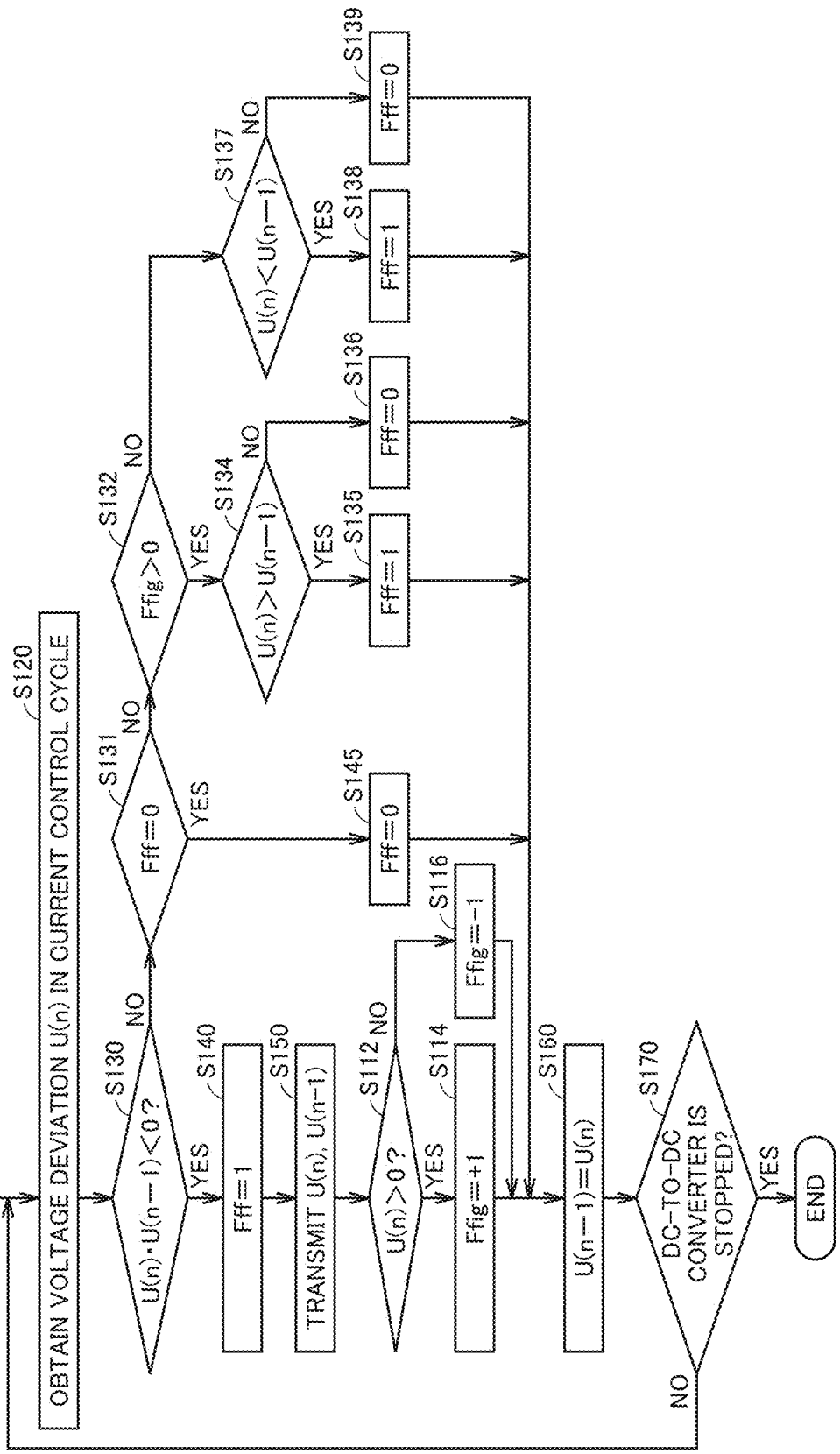
FIG. 18 is a flowchart illustrating a control process by a FF control determination unit shown in FIG. 17.

FIG. 18 is a flowchart illustrating a control process by FF control determination unit 10A shown in FIG. 17.

Referring to FIG. 18, in step S110 to S130, as with those in FIG. 4, as DC-to-DC converter 7 starts the operation, FF control determination unit 10A determines whether the polarity of voltage deviation U(n) in the current control cycle has reversed from that of voltage deviation U(n−1) in the immediately preceding control cycle, thereby detecting crossing of target voltage Vf and output voltage Vout.

In a control cycle in which voltage deviations U(n) and U(n−1) have different polarities (YES in S130), FF control determination unit 10A detects crossing of target voltage Vf and output voltage Vout, and performs steps S140 and 150 which are the same as those illustrated in FIG. 4. This sets FF control flag Fff="1," and transmits voltage deviations U(n) and U(n−1) to a FF control variable calculator 20. As a result, calculation for FF control starts in this control cycle.

In steps S112 through S116, FF control determination unit 10A sets a FF control continuation determination flag Ffig. Specifically, in S112, the polarity of voltage deviation U(n) is determined. If U(n)>0 (YES in S112), that is, in the event of an undershoot due to Vf−Vout>0, Ffig="+1" is set in step S114. In contrast, if U(n)≤0 (NO in S112), that is, in the event of an overshoot due to Vf−Vout<0, Ffig="−1" is set in step S116. After steps S112 through S116, U(n−1) U(n) is set in step S160 for the subsequent control cycle, as with FIG. 4.

In contrast, if voltage deviations U(n) and U(n−1) have the same polarity (NO in S130), FF control determination unit 10A determines whether FF control flag Fff="0" in step S131. If Fff="0" and no FF control variable is calculated in the immediately preceding control cycle (YES in S131), FF control determination unit 10A sets FF control flag Fff="0" in step S145, as with FIG. 4. Accordingly, FF control variable calculator 20 sets Cff(n)=0 in the current control cycle.

In contrast, if FF control flag Fff="1" and a. FF control variable is calculated in the immediately preceding control cycle (NO in S131), FF control determination unit 10A performs a FF control variable calculation continuation determination in steps S132 through S139.

In step S132, FF control determination unit 10A determines the polarity of continuation determination flag Ffig that is set in S114. If Ffig>0, that is, if Ffig="+1" (YES in S132), that is, if the feedforward control is initiated by the occurrence of an undershoot, the process proceeds to step S134 and FF control determination unit 10A determines whether voltage deviation U(n) in the current control cycle is greater than voltage deviation U(n−1) in the immediately preceding control cycle. If U(n)>U(n−1) (YES in S134), FF control flag Fff="1" is maintained in S135, and the calculation of the FF control variable continues even in the current control cycle. In contrast, if U(n)<U(n−1) (NO in S134), FF control flag Fff="0" is set in S136, and the calculation of the FF control variable ends even in the current control cycle.

On the contrary, if Ffig="4" (NO in S132), that is, if the feedforward control is initiated by the occurrence of an overshoot, the process proceeds to step S137 and FF control determination unit 10A determines whether voltage deviation U(n) in the current control cycle is less than voltage deviation U(n−1) in the immediately preceding control cycle. If U(n)<U(n−1) (YES in S137), FF control flag Fff="1" is maintained in S138 and the calculation of the FF control variable continues even in the current control cycle. In contrast, if U(n)≥U(n−1) (NO in S137), FF control flag Fff "0" is set in S139 and the calculation of the FF control variable ends even in the current control cycle.

Figure 19:
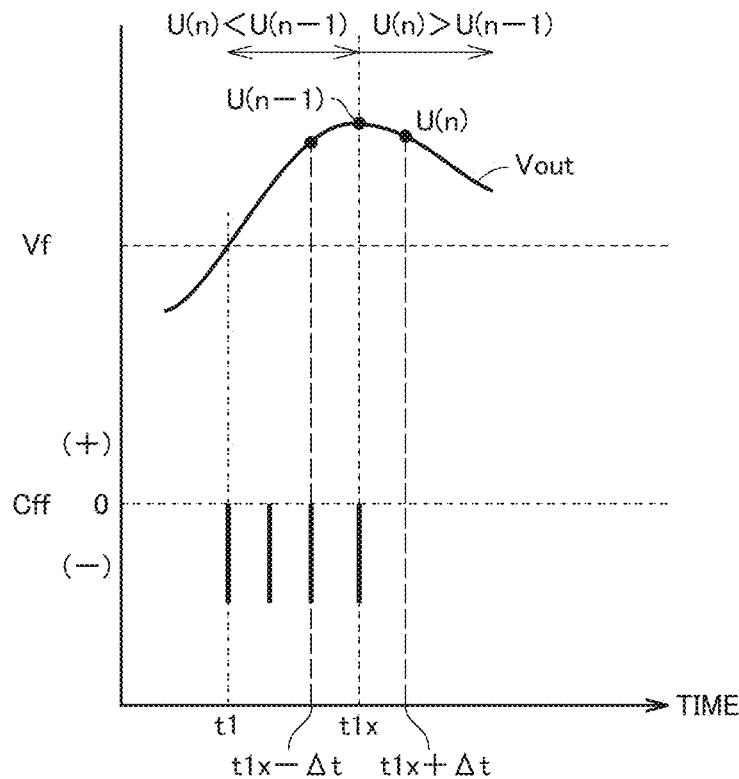
FIG. 19 is a schematic waveform diagram illustrating one example continuation determination process upon initiation of a feedforward control in response to occurrence of an overshoot.

FIG. 19 shows one example continuation determination process when the feedforward control is initiated in response to the occurrence of an overshoot.

Referring to FIG. 19, at time t1, the polarity changes from Vout<Vf, that is, U(n−1)>0 to Vout>Vf, that is, U(n)<0. Thus, Fff="1" is set (S140) and the calculation of FF control variable Cff starts. In this case, Ffig="−1." Thus, determinations in S137 through S139 are performed.

If Ffig="4," U(n)<0, and thus output voltage Vout increases and in the period in which the voltage deviation is increased, that is, |U(n)| is increased, U(n) U(n−1) holds true. In contrast, it is understood that if output voltage Vout, that is, voltage deviation U(n) reaches a local maximum value in a control cycle at time t1x, |U(n)| decreases at time t1x+Δt, which is the subsequent control cycle, and thus U(n)>U(n−1) holds true.

Accordingly, as a result of the determinations in S137 through S139, S137 is YES in the control cycle in the period from time t1 to t1x, FF control flag Fff="1" is maintained (S138), and the calculation of FF control variable Cff continues. In contrast, S137 is NO in the control cycle at time t1x±Δt, FF control flag Fff="0" is set (S139), and the calculation of FF control variable Cff thereby ends.

Figure 20:
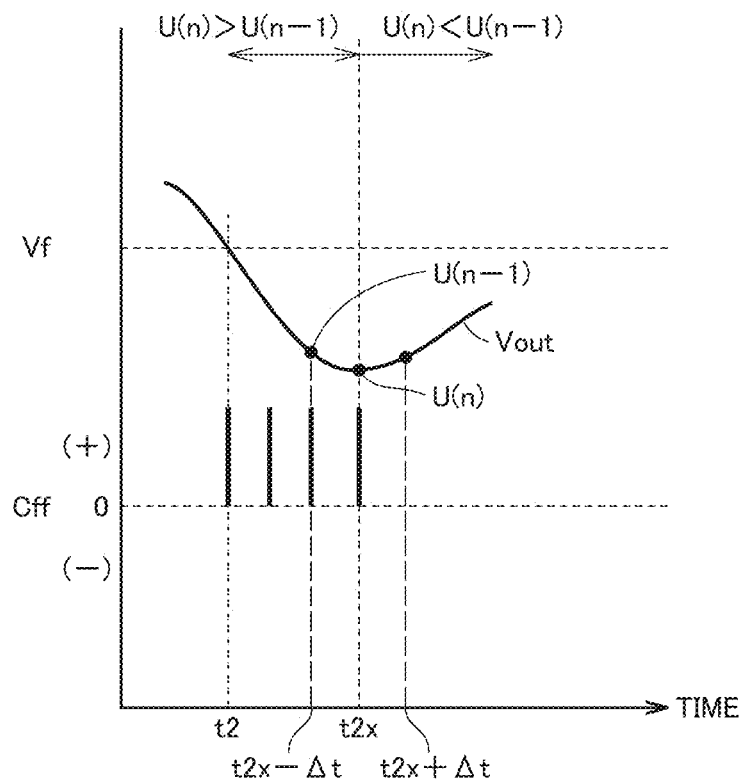
FIG. 20 is a schematic waveform diagram illustrating one example continuation determination process upon initiation of a feedforward control in response to occurrence of an undershoot.

FIG. 20 shows one example continuation determination process when the feedforward control is initiated in response to the occurrence of an undershoot.

Referring to FIG. 20, at time t2, the polarity changes from Vout>Vf, that is, U(n−1)<0 to Vf>Vout, that is, U(n)>0. Thus, Fff="1" is (S140) and calculation of FF control variable Cff starts. In this case, Ffig="+1." Thus, determinations in S134 through S136 are performed.

If Ffig "+1," U(n)>0. Thus, U(n)>U(n−1) holds true in a period in which output voltage Vout decreases and the voltage deviation is increased, that is, |U(n)| is increased. In contrast, it is understood that if voltage deviation U(n) reaches a local minimum value in a control cycle at time t2x, U(n)<U(n−1) holds true at time t2x+Δt, which is the subsequent control cycle, because |U(n)| is decreased at which time.

Accordingly, as a result of the determinations in S134 through S136, S134 is YES in the control cycle in the period from time t2 to t2x, FF control flag Fff="1" is maintained (S135), and the calculation of FF control variable Cff continues. In contrast, S134 is NO in the control cycle at time t2x+Δt, FF control flag Fff="0" is set (S136), and the calculation of FF control variable Cff thereby ends.

As such, according to the FF control variable calculation determination in steps S132 through S139, the calculation of FF control variable Cff initiated in response to the occurrence of an overshoot or undershoot continues for multiple control cycles until output voltage Vout reaches a local extreme value (a local maximum value or a local minimum value).

Referring again to FIG. 17, FF control variable calculator 20 uses FF control flag Fff output from FF control determination unit 10A and voltage deviations U(n) and U(n−1) to calculate FF control variable Cff, according to the equations and FF control gain β set in the same manner as with Embodiment 1 and the variation thereof and Embodiment 2.

Figure 21:
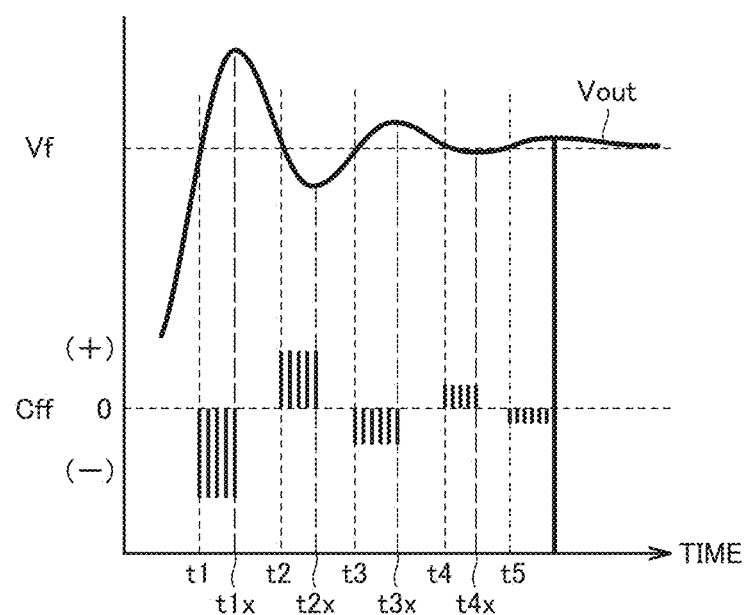
FIG. 21 is a schematic waveform diagram illustrating an example control operation by a FF control variable calculator shown in FIG. 17.

FIG. 21 is a schematic waveform diagram illustrating an example control operation by FF control variable calculator 20 according to Embodiment 3.

Referring to FIG. 21, in the control cycles corresponding to times t1, t3, and t5, the feedforward control is initiated in which a control variable is set (Cff<0) to reduce output voltage Vout to dampen the amplitude of an overshoot. The feedforward control initiated in response to the occurrence of the overshoot continues until output voltage Vout reaches a local maximum value and turns to a decrease at times t1x, t3x, and t5x.

In contrast, in the control cycles corresponding to times t2 and t4, the feedforward control is initiated in which the control variable is set (Cff>0) to increase output voltage Vout to dampen the amplitude of an undershoot. The feedforward control initiated in response to the occurrence of the undershoot continues until output voltage Vout reaches a local minimum value and turns an increase at times t2x and t4x.

Note that in the control process illustrated in FIG. 18, voltage deviations U(n) and U(n−1) are not transmitted in steps S135 and S138. Thus, the FF control variable based on voltage deviations U(n) and U(n−1) transmitted in step S150 at the initiation of the feedforward control, that is, at times t1, t2, t3, t4, and t5, is maintained the same in the period from time t1 to t1x, the period from time t2 to t2x, the period from time t3 to t3x, the period from time t4 to t4x, and the period from time t5 to t5x. However, the FF control variable can be updated by transmitting voltage deviations U(n) and U(n−1) in the control cycle each time at steps S135 and S138.

As described above, in the DC-to-DC converter control device according to Embodiment 3, the FF control variable is calculated for multiple control cycles starting from a control cycle in which a crossing of target voltage Vf and output voltage Vout is detected to a control cycle in which output voltage Vout, that is, voltage deviation U(n) has reached a local extreme value (local maximum value or local minimum value), thereby suppressing an overshoot and an undershoot in a transient state. In other words, it is understood that in the control device according to the present embodiment, the number of control cycles, for which the FF control variable is calculated in the feedforward control that is initiated in response to detection of a crossing of target voltage Vf and output voltage Vout, is not particularly limited.

Regarding the power converter control device according to the present embodiment, a DC-to-DC converter has been illustrated as an example of a power converter controlled by the power converter control device in Embodiment 1 and the variation thereof and Embodiments 2 and 3. However, the control device according to Embodiment 1 and the variation thereof, Embodiment 2, or 3 is applicable for the control of outputs (output current, output power, etc.)) of the DC-to-DC converter, other than output voltage. In other words, the control device according to Embodiment 1 and the variation thereof, Embodiment 2, or 3 can control outputs of a DC-to-DC converter of any circuit structure and input-output characteristics (including non-linear characteristics) if the outputs (output voltage, output current, output power, etc.) change in response to a variation of a control signal according to a control variable.

Furthermore, power converters controlled by the control device are not limited to a DC-to-DC converter. The control device according to Embodiment 1 and the variation thereof, Embodiment 2, or 3 can control outputs (voltage, current, or power, etc.) of other power converters such as AC-to-DC converters, DC-to-AC converters, etc.

The presently disclosed embodiments should be considered in all aspects illustrative and not restrictive. The scope of the present disclosure is defined by the appended claims, rather than by the above description. All changes which come within the meaning and range of equivalency of the appended claims are to be embraced within their scope.

REFERENCE SIGNS LIST 5a, 5b, 5c control device; 7 DC-to-DC converter; 10, 10A FF control determination unit; 20 FF control variable calculator; 30 subtracting unit; 40 FB control variable calculator; 41 proportional action unit; 42 integral action unit; 43 derivative action unit; 44 adding unit; 50 control variable adding unit; 60 switching control signal generator; 100 voltage controller; 110 input data file; 120 learning controller; 130 learning data creator; 140 learning data file; 150 learning data processor; 160 neural network data file; 200 neural network; 300 map; Cfb FB control variable; Cff FF control variable; Cvo voltage control variable; Fflg continuation determination flag (FF control); Fff FF control flag; Iout load current; Kd derivative gain; Ki integral gain; Kp proportional gain; U voltage deviation; Vf target voltage; Vout output voltage; W0 allowable amplitude; WPmax maximum amplitude actual value; Wmax maximum amplitude; k count value; β FF control gain; Δt control cycle.

The invention claimed is:

1. A power converter control device for a power converter whose output changes according to a control signal, the power converter control device comprising:
a feedback controller to calculate, in each control cycle, a first control variable based on a deviation in the output from a target output;
a feedforward controller to calculate during a current control cycle, in response to a determination that a first deviation and a second deviation have different polarities such that the first deviation and the second deviation include a positive deviation and a negative deviation, a second control variable according to a difference between the first deviation and the second deviation so that a change in the output from the current control cycle to a subsequent control cycle is prevented, the first deviation being the deviation in the current control cycle, the second deviation being the deviation in the immediately preceding control cycle; and
a control signal generator to generate the control signal in each control cycle, according to the first control variable and the second control variable.

2. The power converter control device according to claim 1, wherein
the power converter includes a DC-to-DC converter whose output voltage changes according to the control signal,
the target output includes a target voltage,
the feedback controller calculates the first control variable; based on a voltage deviation of the output voltage from the target voltage,
the first deviation includes a first voltage deviation which is the voltage deviation in the current control cycle,
the second deviation includes a second voltage deviation which is the voltage deviation in the immediately preceding control cycle, and
if the first voltage deviation and the second voltage deviation have different polarities, the feedforward controller calculates, during the current control cycle, the second control variable according to a difference between the first voltage deviation and the second voltage deviation so that the change in the output voltage from the current control cycle to the subsequent control cycle is prevented.

3. The power converter control device according to claim 2, wherein
the feedforward controller calculates the second control variable, according to a product of a feedforward control gain and a deviation between the first voltage deviation and the second voltage deviation,
the power converter control device, further comprising:
a learning data creator to collect, while the DC-to-DC converter is in operation, a plurality of sets of learning data, each set including a plurality of predetermined operational data and an actual gain value of the feedforward control gain during the operation; and
a learning data processor to calculate a gain value of the feedforward control gain, using the plurality of sets of learning data collected by the learning data creator and an allowable amplitude value of the output voltage relative to the target voltage,
the plurality of operational data includes a maximum amplitude actual value of the output voltage relative to the target voltage, wherein
the learning data processor includes:
a first calculator to calculate, using the plurality of sets of learning data, a weighting factor between neurons of a neural network which includes a plurality of input layers to which the plurality of operational data are set and an output layer to which the actual gain value is set, and
a second calculator to calculate, as a candidate value of the feedforward control gain, a value obtained in the output layer when the maximum amplitude actual value included in the plurality of operational data is converted into the allowable amplitude value and the allowable amplitude value is set to one of the plurality of input layers in the neural network to which the weighting factor calculated by the first calculator is applied.

4. The power converter control device according to claim 3, wherein
the plurality of operational data further includes an output power of the DC-to-DC converter,
the second calculator sets to the plurality of input layers a plurality of stages of the output powers which are set within a range from a minimum power to a maximum power of the DC-to-DC converter, and calculates a plurality of the candidate values corresponding to the plurality of stages, and
the feedforward controller uses a maximum value, among the plurality of candidate values, as the feedforward control gain.

5. The power converter control device according to claim 3, wherein the plurality of operational data further includes an output power of the DC-to-DC converter, the second calculator inputs a plurality of stages of the output powers which are set within an output power range of the DC-to-DC converter, and calculates a plurality of the candidate values corresponding to the plurality of stages, and using the plurality of candidate values, the feedforward controller determines the feedforward control gain according to a current output power of the DC-to-DC converter.

6. The power converter control device according to claim 3, wherein the when the DC-to-DC converter is stopped, the first calculator performs a computing process for calculating the weighting factor.

7. The power converter control device according to claim 1, wherein the feedforward controller calculates the second control variable only in a control cycle in which the first deviation and the second deviation have different polarities.

8. The power converter control device according to claim 1, wherein the feedforward controller calculates the second control variable from a control cycle in which the first deviation and the second deviation have different polarities until a control cycle in which the deviation in the output reaches a local extreme value.

* * * * *